United States Patent
Hamashima et al.

(10) Patent No.: US 12,255,082 B2
(45) Date of Patent: Mar. 18, 2025

(54) SUBSTRATE PROCESSING METHOD

(71) Applicant: Tokyo Electron Limited, Tokyo (JP)

(72) Inventors: Yuta Hamashima, Kumamoto (JP); Jun Nonaka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 434 days.

(21) Appl. No.: 17/863,427

(22) Filed: Jul. 13, 2022

(65) Prior Publication Data

US 2023/0015936 A1 Jan. 19, 2023

(30) Foreign Application Priority Data

Jul. 14, 2021 (JP) ................................. 2021-116117

(51) Int. Cl.
*H01L 21/67* (2006.01)

(52) U.S. Cl.
CPC .. *H01L 21/67034* (2013.01); *H01L 21/67051* (2013.01); *H01L 21/67057* (2013.01)

(58) Field of Classification Search
CPC ......... H01L 21/67034; H01L 21/67051; H01L 21/67057

USPC ...................................................... 134/102.3
See application file for complete search history.

(56) References Cited

U.S. PATENT DOCUMENTS

2016/0089696 A1* 3/2016 Kimura ............. H01L 21/67028
427/299

FOREIGN PATENT DOCUMENTS

JP 2013-58696 A 3/2013

* cited by examiner

*Primary Examiner* — Tinsae B Ayalew
(74) *Attorney, Agent, or Firm* — XSENSUS LLP

(57) ABSTRACT

A substrate processing method arranges a plurality of substrates in a storage area of a chamber, supplies an organic solvent to the plurality of substrates, arranges the plurality of substrates in a drying area, supplies a vapor of a hydrophobizing agent from a hydrophobizing agent nozzle to the plurality of substrates, arranges the plurality of substrates in the storage area, supplies an organic solvent from a first organic solvent nozzle to the plurality of substrates, supplies a vapor of an organic solvent from a second organic solvent nozzle to the drying area in a state where a liquid is stored in the storage area and the plurality of substrates are dipped in a liquid.

16 Claims, 25 Drawing Sheets

SUBSTRATE PROCESSING METHOD

CROSS-REFERENCE TO RELATED APPLICATIONS

The present application is based upon and claims the benefit of priority to Japanese Patent Application No. 2021-116117, filed on Jul. 14, 2021, the entire contents of which are herein incorporated by reference.

FIELD

The present disclosure relates to a substrate processing method.

BACKGROUND

In a drying process that dries a substrate such as a semiconductor wafer, a circuit pattern (that will simply be called a "pattern" below) that is formed on a surface of such a substrate may be collapsed by surface tension of a liquid.

Herein, a technique to prevent or reduce collapse of a pattern and dry a substrate by causing a drying vapor where a drying liquid such as an organic solvent is vaporized to contact such a substrate after a liquid process so as to replace a processing liquid on such a substrate with such a drying liquid and subsequently removing such a drying liquid from such a substrate by volatilization thereof, etc., has been known.

SUMMARY

A substrate processing method according to an aspect of the present disclosure is a substrate processing method that collectively executes a drying process for a plurality of substrates in a wet state thereof. A substrate processing method according to an embodiment includes a first arrangement step, a first replacement step, a second arrangement step, a second replacement step, a third arrangement step, a third replacement step, and a chamber cleaning step. The first arrangement step arranges the plurality of substrates in a storage area of a chamber that is capable of accommodating the plurality of substrates where the chamber has a gastight space that includes the storage area where a liquid is stored and a drying area that is located above the storage area. The first replacement step supplies an organic solvent from a first organic solvent nozzle to the plurality of substrates to replace a liquid that is attached to the plurality of substrates with an organic solvent, after the first arrangement step. The second arrangement step arranges the plurality of substrates in the drying area, after the first replacement step. The second replacement step supplies a vapor of a hydrophobizing agent from a hydrophobizing agent nozzle to the plurality of substrates to replace an organic solvent that is attached to the plurality of substrates with a hydrophobizing agent, after the second arrangement step. The third arrangement step arranges the plurality of substrates in the storage area, after the second replacement step. The third replacement step supplies an organic solvent from the first organic solvent nozzle to the plurality of substrates to replace a hydrophobizing agent that is attached to the plurality of substrates with an organic solvent, after the third arrangement step. The chamber cleaning step supplies a vapor of an organic solvent from a second organic solvent nozzle to the drying area in a state where a liquid is stored in the storage area and the plurality of substrates are dipped in a liquid, to clean the chamber, after the third replacement step.

DESCRIPTION OF EMBODIMENTS

Figure 1:
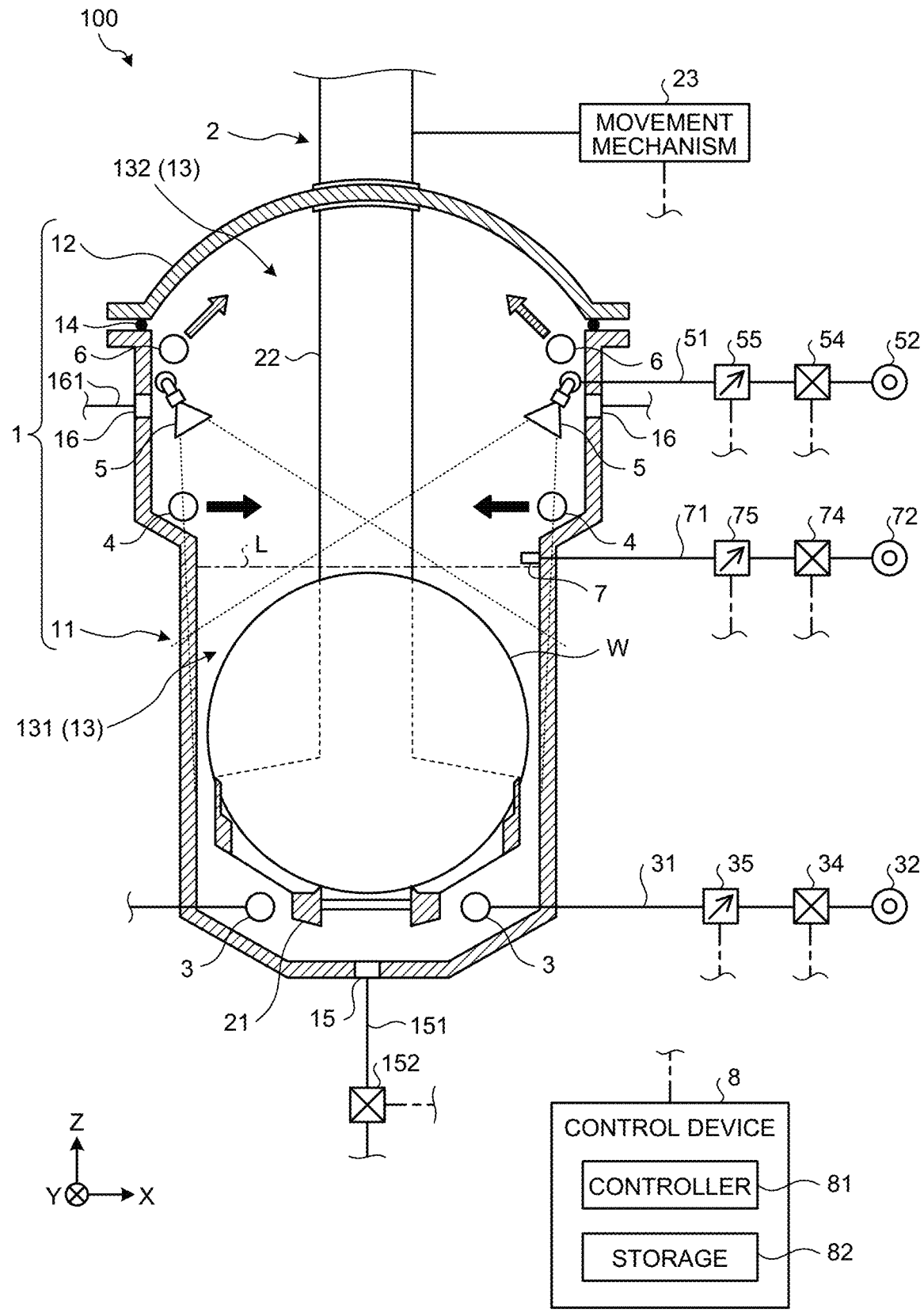
FIG. 1 is a schematic cross-sectional view of a substrate processing apparatus according to an embodiment.

Hereinafter, a mode(s) (that will be described as "an embodiment(s)" below) for implementing a substrate processing method according to the present disclosure will be explained in detail with reference to the drawing(s). Additionally, the present disclosure is not limited by such an embodiment(s). Furthermore, it is possible to combine respective embodiments appropriately unless process contents thereof are inconsistent. Furthermore, an identical site in each/respective embodiment(s) as provided below will be provided with an identical sign so as to omit a redundant explanation(s) thereof.

Furthermore, although an expression of "constant", "orthogonal", "perpendicular", or "parallel" may be used in an embodiment(s) as illustrated below, such an expression does not have to be strictly "constant", "orthogonal", "perpendicular", or "parallel". That is, each expression as described above tolerates a deviation in, for example, manufacturing accuracy, installation accuracy, etc.

Furthermore, in each drawing that will be referred to below, a direction(s) of an X-axis, a direction(s) of a Y-axis, and a direction(s) of a Z-axis that are orthogonal to one another are defined for providing an understandable explanation(s), and an orthogonal coordinate system where a positive direction of such a Z-axis is provided as a vertically upward direction may be illustrated therein.

Configuration of Substrate Processing Apparatus

First, a configuration of a substrate processing apparatus according to an embodiment will be explained with reference to FIG. 1. FIG. 1 is a schematic cross-sectional view of a substrate processing apparatus according to an embodiment.

A substrate processing apparatus 100 according to an embodiment as illustrated in FIG. 1 collectively executes a drying process for a plurality of semiconductor substrates (that will be described as substrates W below) in a wet state thereof after a liquid process thereof. A liquid process is not particularly limited, and is, for example, an etching process, a cleaning process, etc.

A pattern is formed on a surface of each substrate W where such a pattern may be collapsed by surface tension of a liquid that penetrates between patterns in a case where simple drying thereof is executed. Hence, the substrate processing apparatus 100 causes a vapor of an organic solvent to contact a substrate after a liquid process thereof so as to replace a processing liquid on such a substrate with a drying liquid, and subsequently, removes such as organic solvent from such a substrate by volatilization thereof, etc. Thereby, it is possible for the substrate processing apparatus 100 to dry a substrate while collapse of a pattern is prevented or reduced.

Herein, an inventor(s) of the present application has/have found that a correlation is present between a particle(s) on a substrate and collapse of a pattern as a result of an active study thereof. Specifically, such an inventor(s) of the present application has/have provided a substrate with a gradient of an amount of a particle(s) along a radial direction of such a substrate, and has/have measured a number of a collapsed pattern(s) along such a radial direction of such a substrate (that is, along such a gradient of an amount of a particle(s)). As a result, such an inventor(s) of the present application has/have found that a number of a collapsed pattern(s) is increased with increasing an amount of a particle(s). Thus, such an inventor(s) of the present application has/have found that a particle(s) on a substrate is/are one of factors that cause collapse of a pattern(s).

For example, a particle(s) that is/are attached to an inside of a chamber where a drying process for a substrate is executed is/are transferred to such a substrate, so that attachment of a particle(s) to a substrate is caused. Hence, the substrate processing apparatus 100 according to an embodiment is provided with a mechanism that cleans an inside of a chamber so as to prevent or reduce particle contamination in such a chamber, and thereby, attain further prevention or reduction of collapse of a pattern(s) on a substrate.

As illustrated in FIG. 1, the substrate processing apparatus 100 includes a chamber 1 and a holding unit 2. Furthermore, the substrate processing apparatus 100 includes a plurality of rinse nozzles 3, a plurality of hydrophobizing agent nozzles 4, a plurality of first organic solvent nozzles 5, a plurality of second organic solvent nozzles 6, and at least one third organic solvent nozzle 7. Furthermore, the substrate processing apparatus 100 includes a control device 8.

Chamber 1

The chamber 1 includes a processing tank 11 and a lid body 12. The processing tank 11 is a container with a top that is opened and is capable of accommodating a plurality of substrates W that are arranged in a perpendicular attitude (a vertically oriented state) thereof. The processing tank 11 is capable of storing a rinse liquid that is supplied from a rinse nozzle 3 as described later. A rinse liquid is, for example, a deionized water (DIW). The lid body 12 is a member that covers a top of the processing tank 11, and is configured to be capable of being lifted or lowered, together with the holding unit 2 as described later. The lid body 12 is configured to be capable of being lifted or lowered by a movement mechanism 23 as described later where it is possible to carry a plurality of substrates W in the chamber 1 or carry out them from the chamber 1, by lifting the lid body 12.

The lid body 12 is placed on a top of the processing tank 11, so that a gastight space 13 that is capable of accommodating a plurality of substrates W is formed inside the chamber 1. Additionally, the chamber 1 may have a seal member 14 such as an O-ring between the processing tank 11 and the lid body 12. As such a configuration is provided, it is possible to maintain gastightness of the gastight space 13.

The gastight space 13 has a storage area 131 where a DIW that is supplied from a rinse nozzle 3 as described later is stored, and a drying area 132 that is located above such a storage area 131. Specifically, a water level L is provided as a water level where it is possible to dip a whole of a plurality of substrates W that are lowered to a lowest position where they are capable of being moved by the holding unit 2 in the gastight space 13 and it does not contact such a plurality of substrates W that are lifted to a highest position where they are capable of being moved by the holding unit 2 in the gastight space 13. In such a case, the storage area 131 is an area below a water level L in the gastight space 13. Furthermore, the drying area 132 is an area above a water level L in the gastight space 13. Additionally, a third organic solvent nozzle 7 as described later is arranged at a position slightly above such a water level L. Hence, a definition may be provided in such a manner that the storage area 131 is an area below a third organic solvent nozzle 7 as described later and the drying area 132 is an area above such a third organic solvent nozzle 7.

A drain port 15 for discharging a DIW from the processing tank 11 is provided on a bottom wall of the processing tank 11. A drain route 151 is connected to the drain port 15. A valve 152 that opens or closes the drain route 151 is provided on a halfway part of the drain route 151. The valve 152 is electrically connected to a controller 81 as described later and is controlled so as to be opened or closed by the controller 81.

Furthermore, a plurality of exhaust ports 16 that discharge a gas in the gastight space 13 are provided on a side wall of the processing tank 11. An exhaust port 16 is connected to a non-illustrated exhaust mechanism such as a vacuum pump through an exhaust route 161. An atmosphere in the gastight space 13 is discharged to an outside thereof through the exhaust port 16 and the exhaust route 161 by such an exhaust mechanism.

The plurality of exhaust port 16 are arranged above a hydrophobizing agent nozzle 4 as described later. Furthermore, the plurality of exhaust port 16 are arranged below a second organic solvent nozzle 6 as described later. As such a configuration is provided, it is possible to discharge a vapor that fills the drying area 132 (a vapor of a hydrophobizing agent and a vapor of an organic solvent) efficiently.

Holding Unit 2

The holding unit 2 includes a holding body 21, a shaft 22 that supports the holding body 21, and a movement mechanism 23 that lifts or lowers the shaft 22. The holding body 21 holds a plurality of substrates W in a perpendicular attitude thereof. Furthermore, the holding body 21 holds a plurality of substrates W in a state where they are arranged at a regular interval(s) in a horizontal direction (herein, a direction of a Y-axis). The shaft 22 extends along a vertical direction (herein, a direction of a Z-axis) and supports the holding body 21 on a bottom thereof. The shaft 22 is inserted through a non-illustrated opening that is provided on a top of the lid body 12 so as to be capable of being slid therein.

The movement mechanism 23 includes, for example, a motor, a ball screw, a cylinder, etc., and is connected to the shaft 22 of the holding unit 2 so as to lift or lower the shaft 22. The shaft 22 is lifted or lowered by the movement mechanism 23, so that the holding body 21 that is supported by the shaft 22 is lifted or lowered. Thereby, it is possible for the movement mechanism 23 to lift or lower a plurality of substrates W that are held by the holding body 21, between the storage area 131 and the drying area 132. The movement mechanism 23 is electrically connected to the controller 81 of the control device 8, and is controlled by the controller 81.

Various Types of Nozzles

The plurality of rinse nozzle 3 are arranged in the storage area 131. Specifically, the plurality of rinse nozzle 3 are provided on a bottom part of the processing tank 11. A rinse liquid supply source 32 is connected to a rinse nozzle 3 through a supply route 31. The rinse liquid supply source 32 supplies a DIW to two rinse nozzles 3.

A valve 34 and a flow controller 35 are provided on the supply route 31. The valve 34 opens or closes the supply route 31. The flow controller 35 controls a flow of a processing liquid that flows through the supply route 31. The valve 34 and the flow controller 35 are electrically connected to the controller 81 of the control device 8, and is controlled by the controller 81.

The plurality of hydrophobizing agent nozzles 4, the plurality of first organic solvent nozzles 5, the plurality of second organic solvent nozzles 6, and the third organic solvent nozzle 7 are arranged in the drying area 132. Specifically, these are arranged on both side walls of the chamber 1 in the drying area 132.

These are arranged in order of a third organic solvent nozzle 7, a hydrophobizing agent nozzle 4, a first organic solvent nozzle 5, and a second organic solvent nozzle 6 from a bottom to a top of the drying area 132.

A hydrophobizing agent nozzle 4 supplies a vapor of a hydrophobizing agent to the drying area 132. Specifically, a hydrophobizing agent nozzle 4 discharges a vapor of a hydrophobizing agent horizontally from a vicinity of a side wall of the chamber 1 in the drying area 132 to an inside of the drying area 132. Additionally, a supply system for a vapor of a hydrophobizing agent will be described later.

A first organic solvent nozzle 5 is arranged above a hydrophobizing agent nozzle 4. A first organic solvent nozzle 5 supplies a liquid of an organic solvent from the drying area 132 to the storage area 131. Specifically, a first organic solvent nozzle 5 is a spray nozzle so as to spray a liquid of an organic solvent in a conical form or a fan-like form. The plurality of first organic solvent nozzles 5 are arranged along an arrangement direction of a plurality of substrates W (a direction of a Y-axis). Thereby, it is possible for the plurality of first organic solvent nozzles 5 to supply a liquid of an organic solvent to whole surface of a plurality of substrates W efficiently.

An organic solvent supply source 52 is connected to a first organic solvent nozzle 5 through a supply route 51. The organic solvent supply source 52 supplies a liquid of an organic solvent to the plurality of first organic solvent nozzles 5. In an embodiment, the organic solvent supply source 52 supplies a liquid of isopropyl alcohol (IPA) to a first organic solvent nozzle 5. Hereinafter, a liquid of IPA will be called an "IPA liquid".

A valve 54 and a flow controller 55 are provided on the supply route 51. The valve 54 opens or closes the supply route 51. The flow controller 55 controls a flow of an IPA liquid that flows through the supply route 51. The valve 54 and the flow controller 55 are electrically connected to the controller 81 of the control device 8, and is controlled by the controller 81.

A second organic solvent nozzle 6 is arranged above a first organic solvent nozzle 5. A second organic solvent nozzle 6 supplies a vapor of an organic solvent to the drying area 132. Specifically, a second organic solvent nozzle 6 discharges a vapor of an organic solvent upward or obliquely upward from a vicinity of a side wall of the chamber 1 in the drying area 132 to a top of the drying area 132, that is, the lid body 12. Additionally, FIG. 1 illustrates an example of a case where a second organic solvent nozzle 6 discharges a vapor of an organic solvent obliquely upward. Additionally, a supply system for a vapor of an organic solvent will be described later.

A third organic solvent nozzle 7 is arranged below a hydrophobizing agent nozzle 4. Specifically, a third organic solvent nozzle 7 is arranged at a position that is slightly higher than a liquid level (a water level L) of a DIW that is stored in the storage area 131. A third organic solvent nozzle 7 supplies a liquid of an organic solvent to a liquid level of a DIW that is stored in the storage area 131. Thereby, a third organic solvent nozzle 7 forms a liquid film of an organic solvent on a liquid level of a DIW that is stored in the storage area 131.

An organic solvent supply source 72 is connected to a third organic solvent nozzle 7 through a supply route 71. The organic solvent supply source 72 supplies a liquid of an organic solvent to a third organic solvent nozzle 7. In an embodiment, the organic solvent supply source 72 supplies an IPA liquid to a third organic solvent nozzle 7.

A valve 74 and a flow controller 75 are provided on the supply route 71. The valve 74 opens or closes the supply route 71. The flow controller 75 controls a flow of an IPA liquid that flows through the supply route 71. The valve 74 and the flow controller 75 are electrically connected to the controller 81 of the control device 8, and is controlled by the controller 81.

Control Device 8

The control device 8 is, for example, a computer, and includes the controller 81 and a storage 82. The storage 82 is realized by, for example, a semiconductor memory element such as a RAM and/or a flash memory (Flash Memory) or a storage device such as a hard disk and/or an optical disk, and stores a program that controls various types of processes that are executed by the substrate processing apparatus 100. The controller 81 includes a microcomputer that has a Central Processing Unit (CPU), a Read Only Memory (ROM), a Random Access Memory (RAM), an input/output port, etc., and/or various types of circuits, and reads and executes a program that is stored in the storage 82 so as to control an operation of the substrate processing apparatus 100.

Additionally, such a program may be recorded in a computer-readable storage medium or may be installed from such a storage medium into the storage 82 of the control device 8. A computer-readable storage medium is, for example, a hard disk (HD), a flexible disk (FD), a compact disk (CD), a magneto-optical disk (MO), a memory card, etc.

Supply System for Hydrophobizing Agent Nozzle 4 and Second Organic Solvent Nozzle 6

Figure 2:
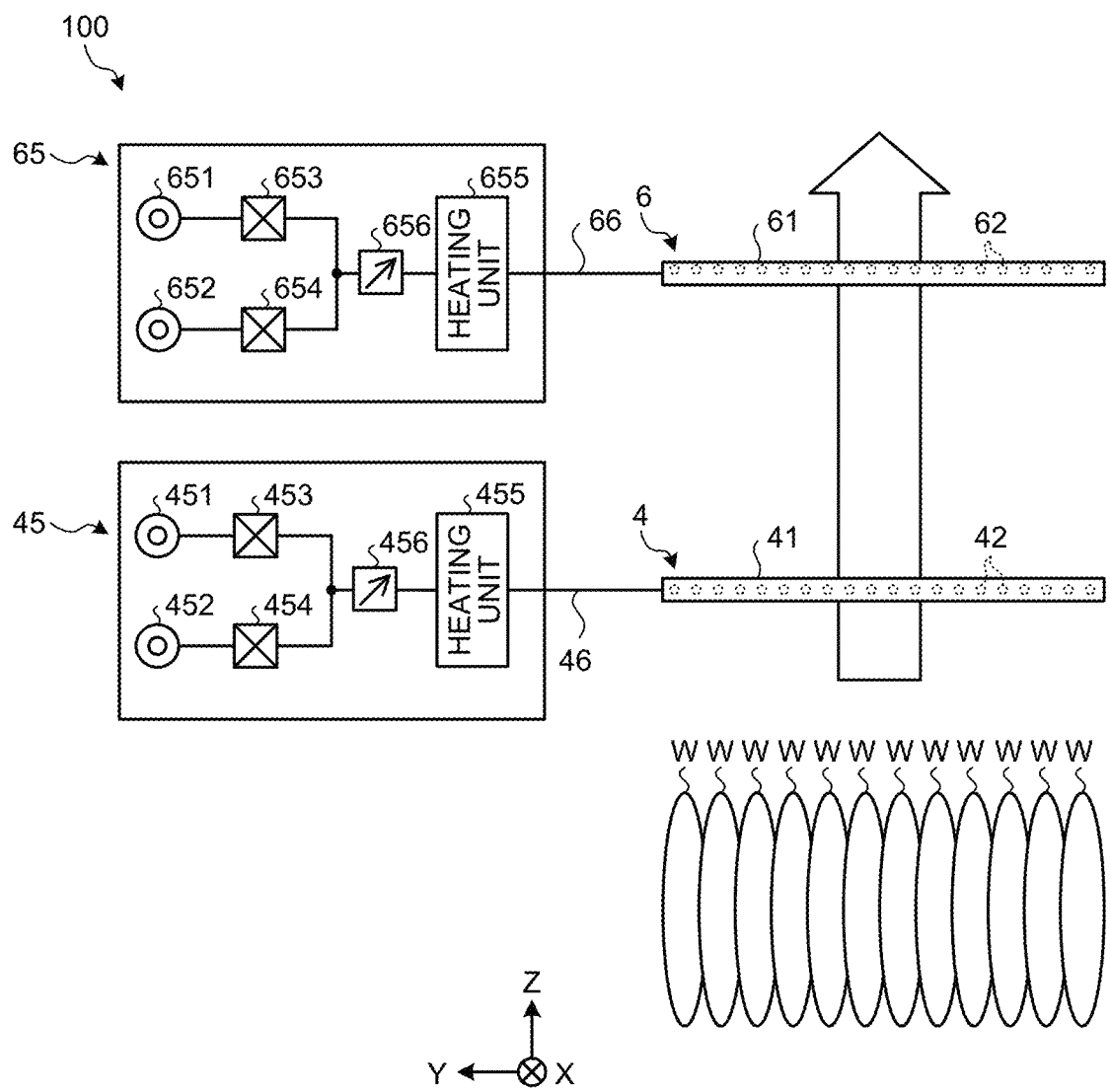
FIG. 2 is a schematic side view that illustrates a configuration of a hydrophobizing agent nozzle and a second organic solvent nozzle according to an embodiment.

FIG. 2 is a schematic side view that illustrates a configuration of a hydrophobizing agent nozzle 4 and a second organic solvent nozzle 6 according to an embodiment.

As illustrated in FIG. 2, a hydrophobizing agent nozzle 4 includes a body unit 41 with an elongated cylindrical shape that extends along an arrangement direction of a plurality of substrates W (a direction of a Y-axis) and a plurality of discharge ports 42 that are formed on such a body unit 41 at an interval(s) along such an arrangement direction of such a plurality of substrates. For a discharge port 42, a nozzle chip for spray that sprays a vapor of a hydrophobizing agent in a form of a mist, etc., as well as a simple opening, may be used. Furthermore, a hydrophobizing agent nozzle 4 may have a discharge port with a slit shape that extends along an arrangement direction of a plurality of substrates W, instead of the plurality of discharge ports 42.

Similarly, a second organic solvent nozzle 6 includes a body unit 61 with an elongated cylindrical shape that extends along an arrangement direction of a plurality of substrates W (a direction of a Y-axis) and a plurality of discharge ports 62 that are formed on such a body unit 61 at an interval(s) along such an arrangement direction of such a plurality of substrates. For a discharge port 62, a nozzle chip for spray that sprays a vapor of an organic solvent in a form of a mist, etc., as well as a simple opening, may be used. Furthermore, a second organic solvent nozzle 6 may have a discharge port with a slit shape that extends along an arrangement direction of a plurality of substrates W, instead of the plurality of discharge ports 62.

A hydrophobizing agent nozzle 4 is connected to a vapor supply system 45 through a supply route 46 (an example of a hydrophobizing agent supply route). The vapor supply system 45 includes a hydrophobizing agent supply source 451, a gas supply source 452, valves 453, 454, a heating unit 455, and a flow controller 456. The hydrophobizing agent supply source 451 supplies a hydrophobizing agent in a liquid state thereof and the gas supply source 452 supplies an $N_2$ (nitrogen) gas (an example of a drying gas) that is an inert gas.

Herein, a hydrophobizing agent is provided by, for example, diluting a hydrophobizing agent for hydrophobizing a surface of a substrate W with a thinner by a predetermined concentration. For a hydrophobizing agent that is a raw material, it is possible to use, for example, a silylation agent or a silane coupling agent, etc.

Specifically, it is possible to use, for example, (trimethylsilyl)dimethylamine (TMSDMA), (dimethylsilyl)dimethylamine (DMSDMA), (trimethylsilyl)diethylamine (TMSDEA), hexamethyldisilazane (HMDS), etc., as a hydrophobizing agent that is a raw material.

Furthermore, for a thinner, it is possible to use an ether-type solvent, an organic solvent that belongs to a ketone, etc. Specifically, it is possible to use, for example, propylene glycol monomethyl ether acetate (PGMEA), cyclohexanone, hydrofluoroether (HFE), etc., as a thinner.

The hydrophobizing agent supply source 451 is connected to the heating unit 455 through a valve 453 and the gas supply source 452 is connected to the heating unit 455 through a valve 454. The valves 453, 454 are electrically connected to the controller 81 and are controlled so as to be opened or closed by the controller 81.

In a case where both of the valves 453, 454 are opened, a mixed fluid of a liquid of a hydrophobizing agent that is supplied from the hydrophobizing agent supply source 451 and an $N_2$ gas that is supplied from the gas supply source 452 is supplied to the heating unit 455. The heating unit 455 heats such a mixed fluid so as to generate a vapor of a hydrophobizing agent (that will be called a "hydrophobizing agent vapor" below). Additionally, a non-illustrated two-fluid nozzle is provided at a later stage of the valve 453 and a mixed fluid that is provided as a mist by such a two-fluid nozzle is supplied to the heating unit 455.

On the other hand, in a case where only the valve 454 is opened, an $N_2$ gas is supplied from the gas supply source 452 to the heating unit 455. In such a case, the heating unit 455 heats an $N_2$ gas so as to generate a hot $N_2$ gas. The heating unit 455 is connected to a hydrophobizing agent nozzle 4 through the supply route 46, so as to supply a hydrophobizing agent vapor or a hot $N_2$ gas to such a hydrophobizing agent nozzle 4.

The flow controller 456 controls a flow of a gas that is supplied to the heating unit 455. For example, the flow controller 456 is configured to include a flow meter, a constant flow valve, an electropneumatic regulator, etc., and controls a pressure of a gas (an $N_2$ gas) that is supplied to such an electropneumatic regulator, etc., so that it is possible to control a flow of a gas that that is supplied to the heating unit 455. The flow controller 456 is electrically connected to the controller 81, and is controlled by the controller 81.

A second organic solvent nozzle 6 is connected to a vapor supply system 65 through a supply route 66 (an example of a second organic solvent supply route). The vapor supply system 65 includes an organic solvent supply source 651, a gas supply source 652, valves 653, 654, a heating unit 655, and a flow controller 656. The organic solvent supply source 651 supplies a liquid of an organic solvent and the gas supply source 652 supplies an $N_2$ gas that is an inert gas. In an embodiment, the organic solvent supply source 651 supplies an IPA liquid.

The organic solvent supply source 651 is connected to the heating unit 655 through a valve 653 and the gas supply source 652 is connected to the heating unit 655 through a valve 654. The valves 653, 654 are electrically connected to the controller 81, and are controlled so as to be opened or closed by the controller 81.

In a case where both of the valves 653, 654 are opened, a mixed fluid of an IPA liquid that is supplied from the organic solvent supply source 651 and an $N_2$ gas that is supplied from the gas supply source 652 is supplied to the heating unit 655. The heating unit 655 heats such a mixed fluid so as to generate an IPA vapor. Additionally, a non-illustrated two-fluid nozzle is provided at a later stage of the valve 653 and a mixed fluid that is provided as a mist by such a two-fluid nozzle is supplied to the heating unit 655.

On the other hand, in a case where only the valve 654 is opened, an $N_2$ gas is supplied from the gas supply source 652 to the heating unit 655. In such a case, the heating unit 655 heats an $N_2$ gas so as to generate a hot $N_2$ gas. The heating unit 655 is connected to a second organic solvent nozzle 6 through the supply route 66, so as to supply an IPA vapor or a hot $N_2$ gas to such a second organic solvent nozzle 6.

The flow controller 656 controls a flow of a gas that is supplied to the heating unit 655. For example, the flow controller 656 is configured to include a flow meter, a constant flow valve, an electropneumatic regulator, etc., and controls a pressure of a gas (an $N_2$ gas) that is supplied to such an electropneumatic regulator, etc., so that it is possible to control a flow of a gas that that is supplied to the heating unit 655. The flow controller 656 is electrically connected to the controller 81, and is controlled by the controller 81.

A hydrophobizing agent nozzle 4 discharges a hydrophobizing agent vapor or a hot $N_2$ gas to a plurality of substrates W horizontally. Furthermore, a second organic solvent nozzle 6 discharges an IPA vapor or a hot $N_2$ gas to a plurality of substrates W upward or obliquely upward.

Specific Operation of Substrate Processing Apparatus

Figure 3:
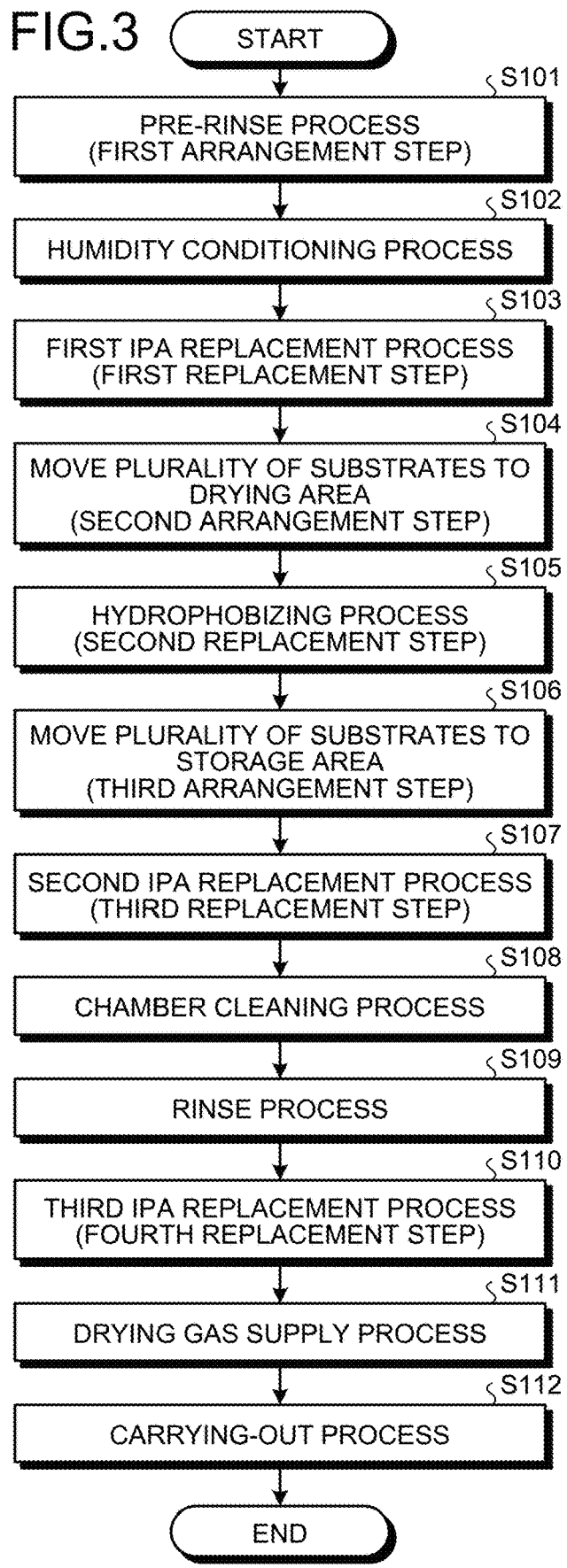
FIG. 3 is a flowchart that illustrates an example of a procedure of a process that is executed by a substrate processing apparatus according to an embodiment.

Next, a specific operation of a substrate processing apparatus 100 according to an embodiment will be explained with reference to FIG. 3 to FIG. 17. FIG. 3 is a flowchart that illustrates an example of a procedure of a process that is executed by the substrate processing apparatus 100 according to an embodiment. Furthermore, FIG. 4 to FIG. 17 are diagrams that illustrate an example of an operation of the substrate processing apparatus 100 according to an embodiment.

As illustrated in FIG. 3, in the substrate processing apparatus 100, a pre-rinse process is executed (step S101). A pre-rinse process corresponds to an example of a first arrangement step. Specifically, a controller 81 opens a valve 34 so as to supply a DIW from a rinse liquid supply source 32 to a processing tank 11 of a chamber 1 and thereby store such a DIW in the processing tank 11, before a plurality of substrates W are carried in the chamber 1. Subsequently, the controller 81 controls a movement mechanism 23 so as to lower a lid body 12 and a shaft 22. Thereby, a top opening of the processing tank 11 is plugged with the lid body 12, so that a gastight space 13 is formed in the chamber 1.

Figure 4:
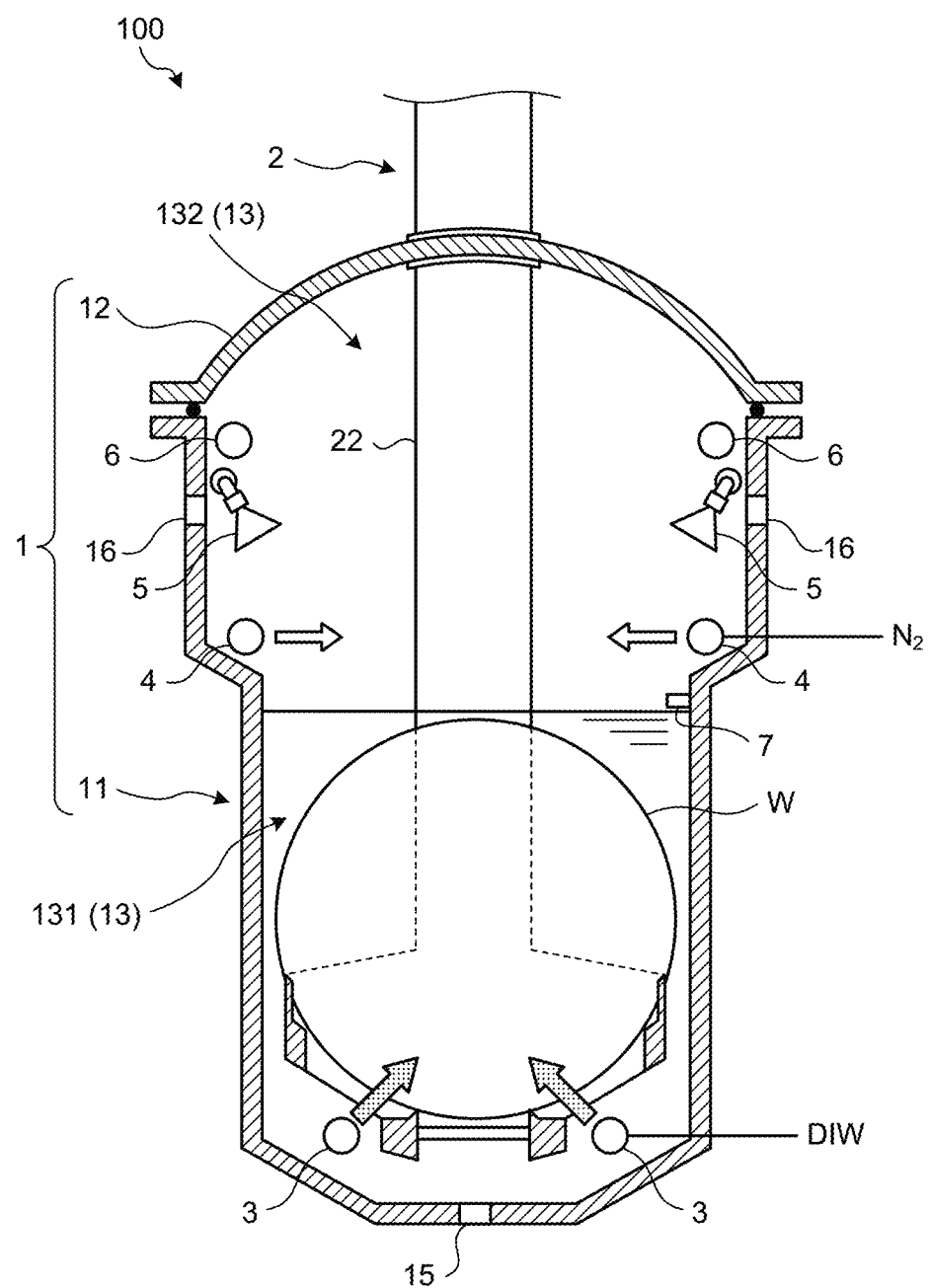
FIG. 4 is a diagram that illustrates an example of an operation of a substrate processing apparatus according to an embodiment.
Figure 5:
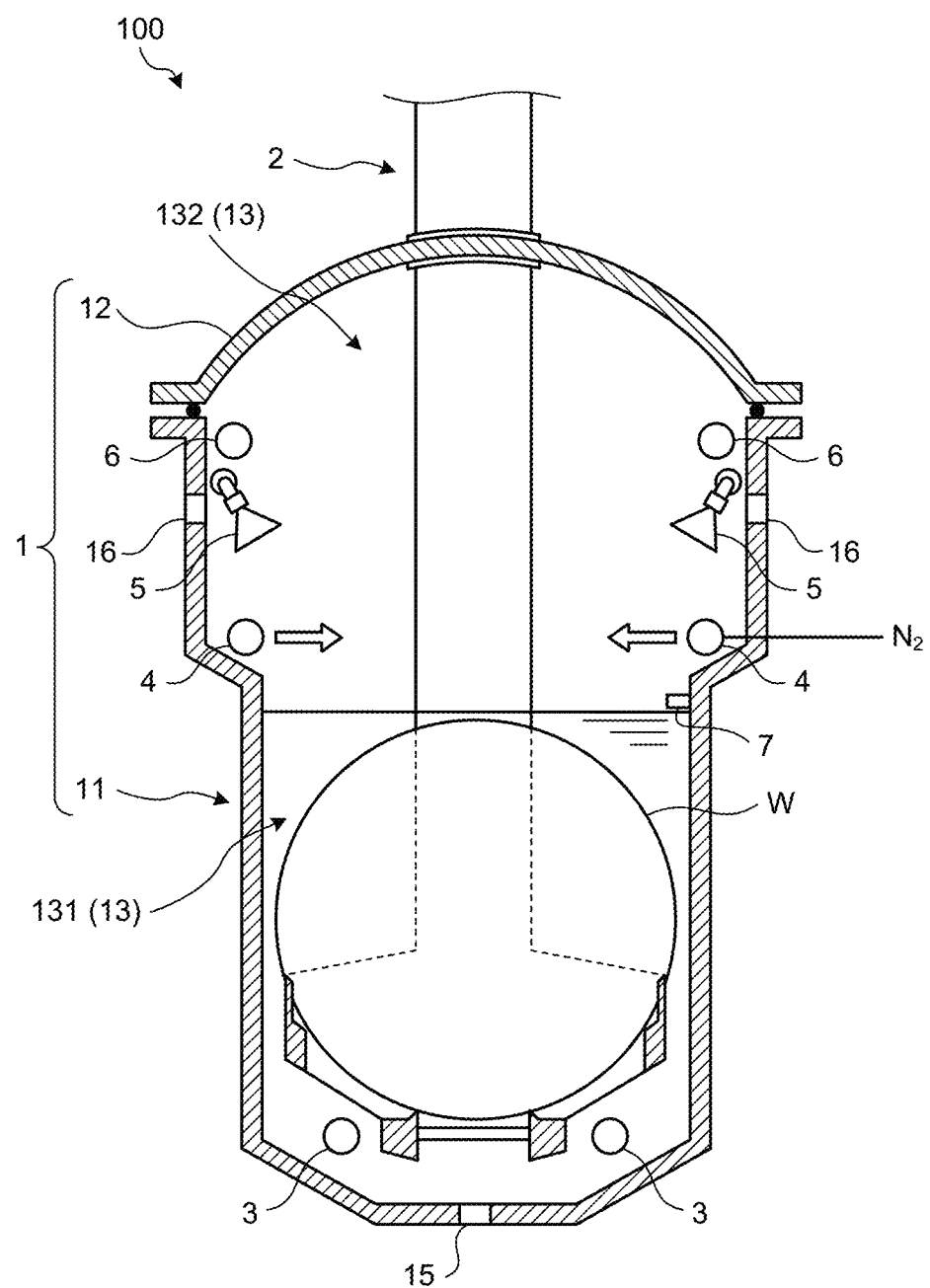
FIG. 5 is a diagram that illustrates an example of an operation of a substrate processing apparatus according to an embodiment.

Subsequently, the controller 81 controls the movement mechanism 23 so as to lower the shaft 22 and thereby dip a plurality of substrates W in a DIW that is stored in the processing tank 11 (see FIG. 4). Thus, a plurality of substrates W are dipped in a DIW, so that it is possible to prevent or reduce drying of such a plurality of substrates W.

Subsequently, in the substrate processing apparatus 100, a humidity conditioning process is executed (step S102). Specifically, the controller 81 controls a vapor supply system 45 so as to supply a hot $N_2$ gas from a hydrophobizing agent nozzle 4 to a drying area 132 (see FIG. 5). A hot $N_2$ gas is supplied to the drying area 132, so that it is possible to reduce a humidity of the drying area 132. Thereby, it is possible to prevent or reduce deactivation of a hydrophobizing agent.

Additionally, supply of a hot $N_2$ gas to the drying area 132 is started simultaneously with a pre-rinse process or before a start of such a pre-rinse process. Furthermore, supply of a hot $N_2$ gas from a hydrophobizing agent nozzle 4 to the drying area 132 is continued until just before a hydrophobizing process as described later is started.

Subsequently, in the substrate processing apparatus 100, a first IPA replacement process where a DIW as a liquid on a plurality of substrates W is replaced with an IPA liquid is executed (step S103). A first IPA replacement process corresponds to an example of a first replacement step.

Figure 6:
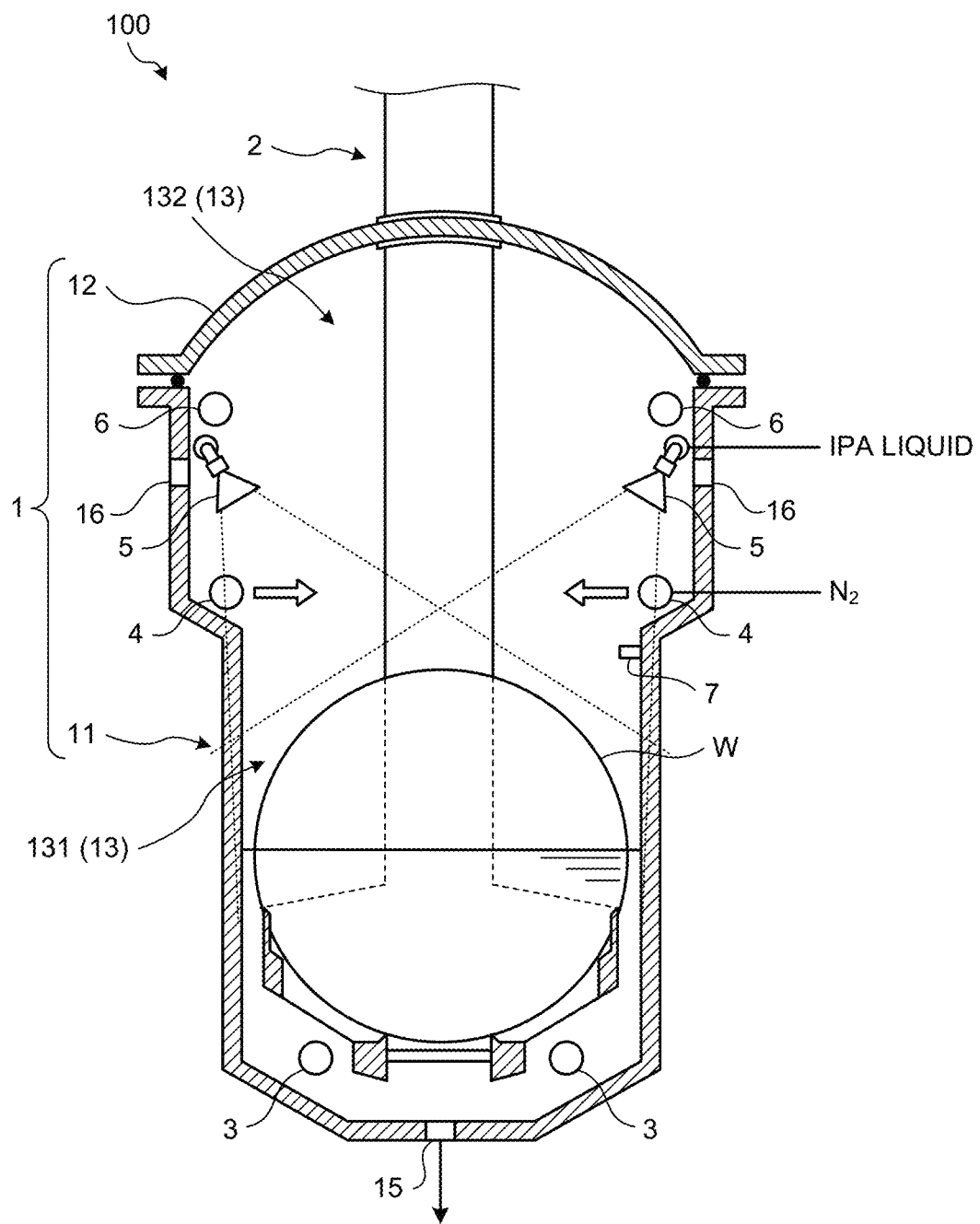
FIG. 6 is a diagram that illustrates an example of an operation of a substrate processing apparatus according to an embodiment.
Figure 7:
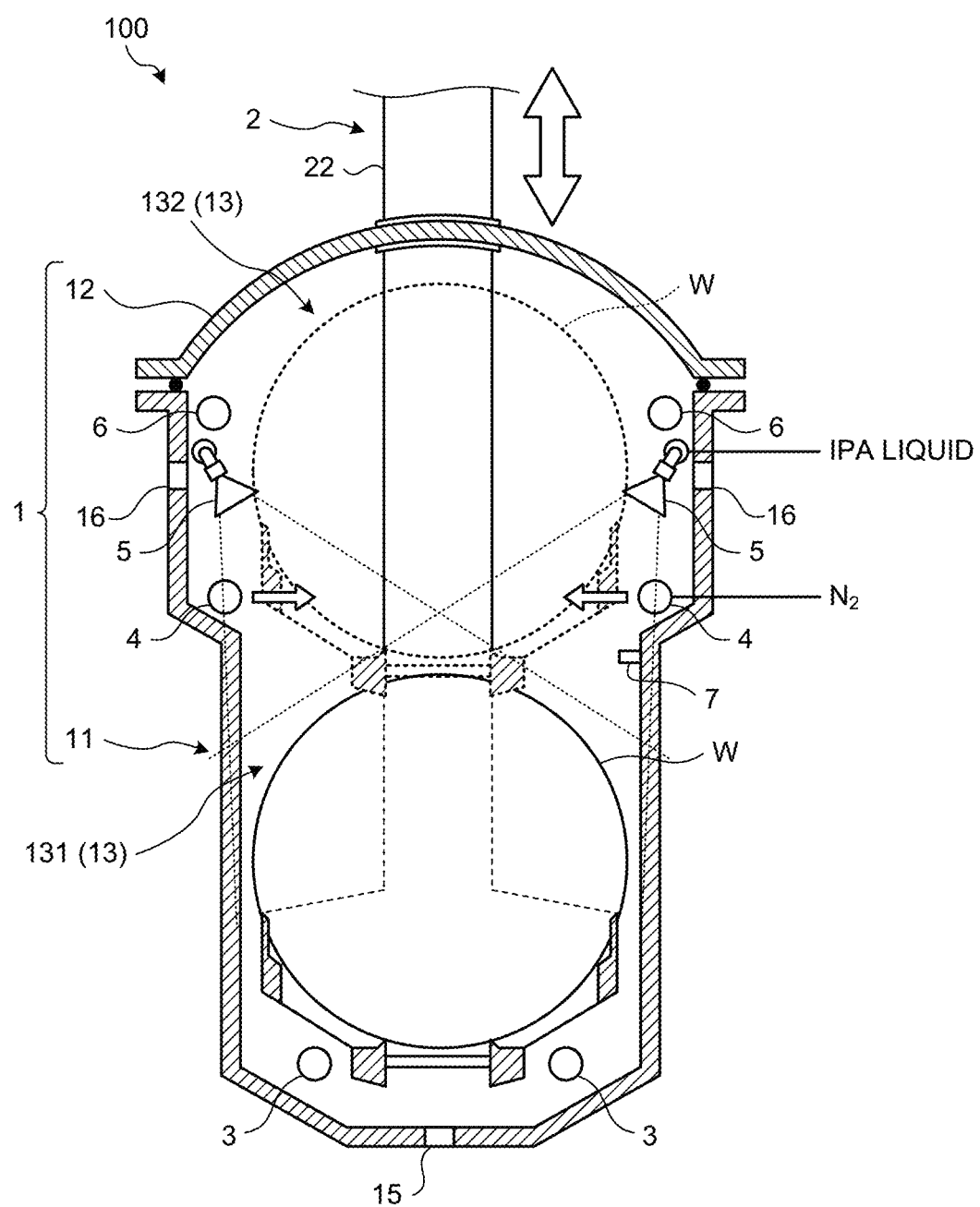
FIG. 7 is a diagram that illustrates an example of an operation of a substrate processing apparatus according to an embodiment.

Specifically, the controller 81 opens a valve 152 (see FIG. 1) so as to discharge a DIW from the processing tank 11 and thereby expose a plurality of substrates W from such a DIW (see FIG. 6). Then, the controller 81 opens a valve 54 (see FIG. 1) so as to supply an IPA liquid from a first organic solvent nozzle 5 to a plurality of substrates W that are exposed from a DIW (see FIG. 7).

Subsequently, the controller 81 controls the movement mechanism 23 so as to cause a plurality of substrates W to reciprocate between a storage area 131 and the drying area 132 in a state where an IPA liquid is discharged from a plurality of second organic solvent nozzles 6. Thus, a plurality of substrates W are moved, so that it is possible to supply IPA to a plurality of substrates W evenly.

A number of reciprocation of a plurality of substrates W may be one or may be two or more. Furthermore, movement of a plurality of substrates W may be one-time movement from the storage area 131 to the drying area 132. Furthermore, the controller 81 does not have to move a plurality of substrates W.

A speed of movement in a case where a plurality of substrates W are moved may be, for example, a speed of 1 mm/sec or greater and 300 mm/sec or less. Thus, a plurality of substrates W are moved at a comparatively low speed, so that it is possible to supply an IPA liquid to such a plurality of substrates W more evenly.

As a first IPA replacement process is ended, the controller 81 closes the valve 54 so as to stop discharging of an IPA liquid from a first organic solvent nozzle 5 to the gastight space 13.

Subsequently, the controller 81 controls the movement mechanism 23 so as to move a plurality of substrates W from the storage area 131 to the drying area 132 (step S104). A process at step S104 corresponds to an example of a second arrangement step.

Additionally, in a case where a first IPA replacement process (step S103) is ended in a state where a plurality of substrates W are located in the drying area 132, a process at step S104 is omitted. In such a case, a first IPA replacement process corresponds to an example of a second arrangement step.

Subsequently, in the substrate processing apparatus 100, a hydrophobizing process where IPA as a liquid on a plurality of substrates W is replaced with a hydrophobizing agent so as to hydrophobize such a plurality of substrates W is executed (step S105). A hydrophobizing process at step S105 corresponds to an example of a second replacement step.

Figure 8:
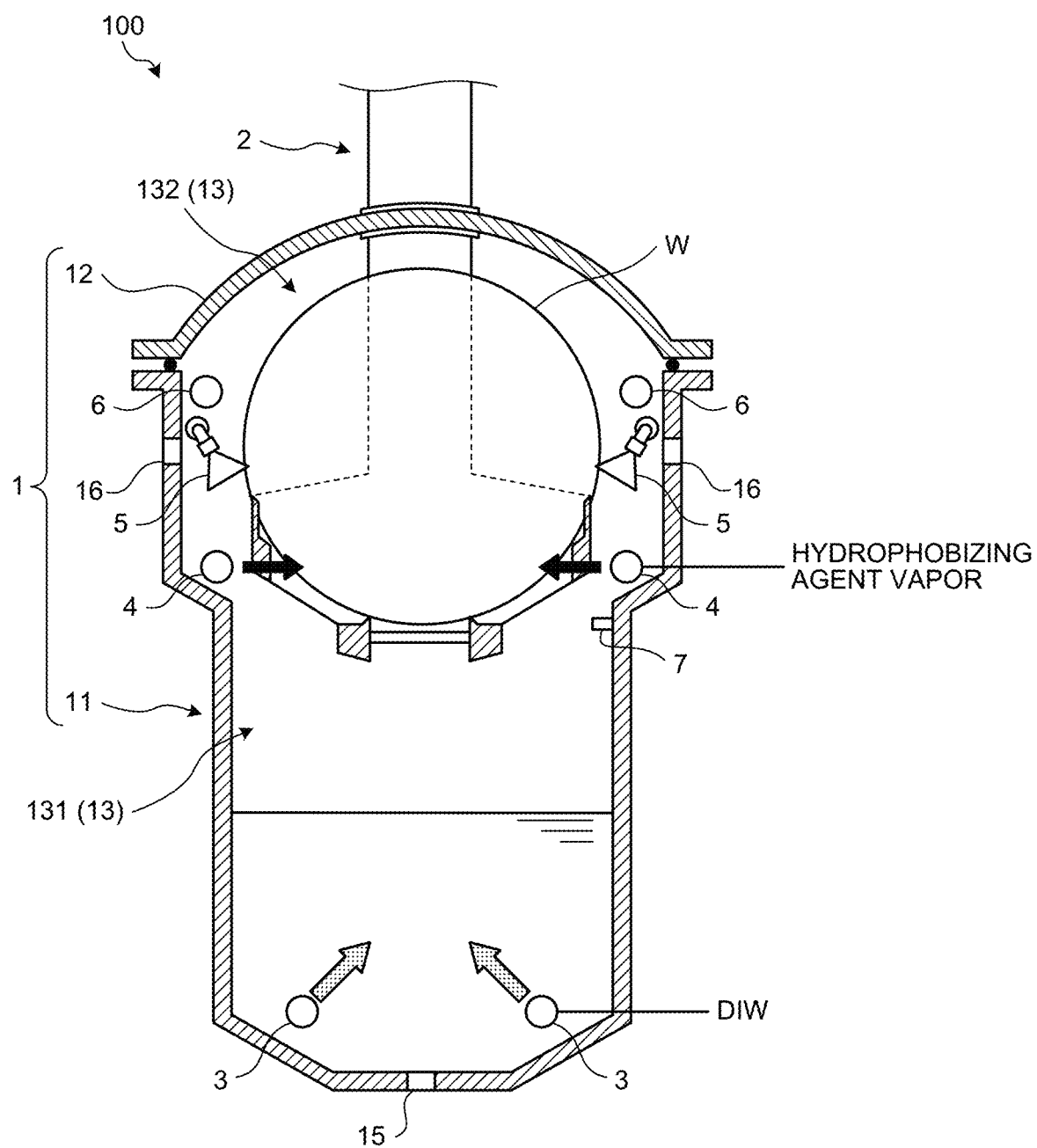
FIG. 8 is a diagram that illustrates an example of an operation of a substrate processing apparatus according to an embodiment.
Figure 9:
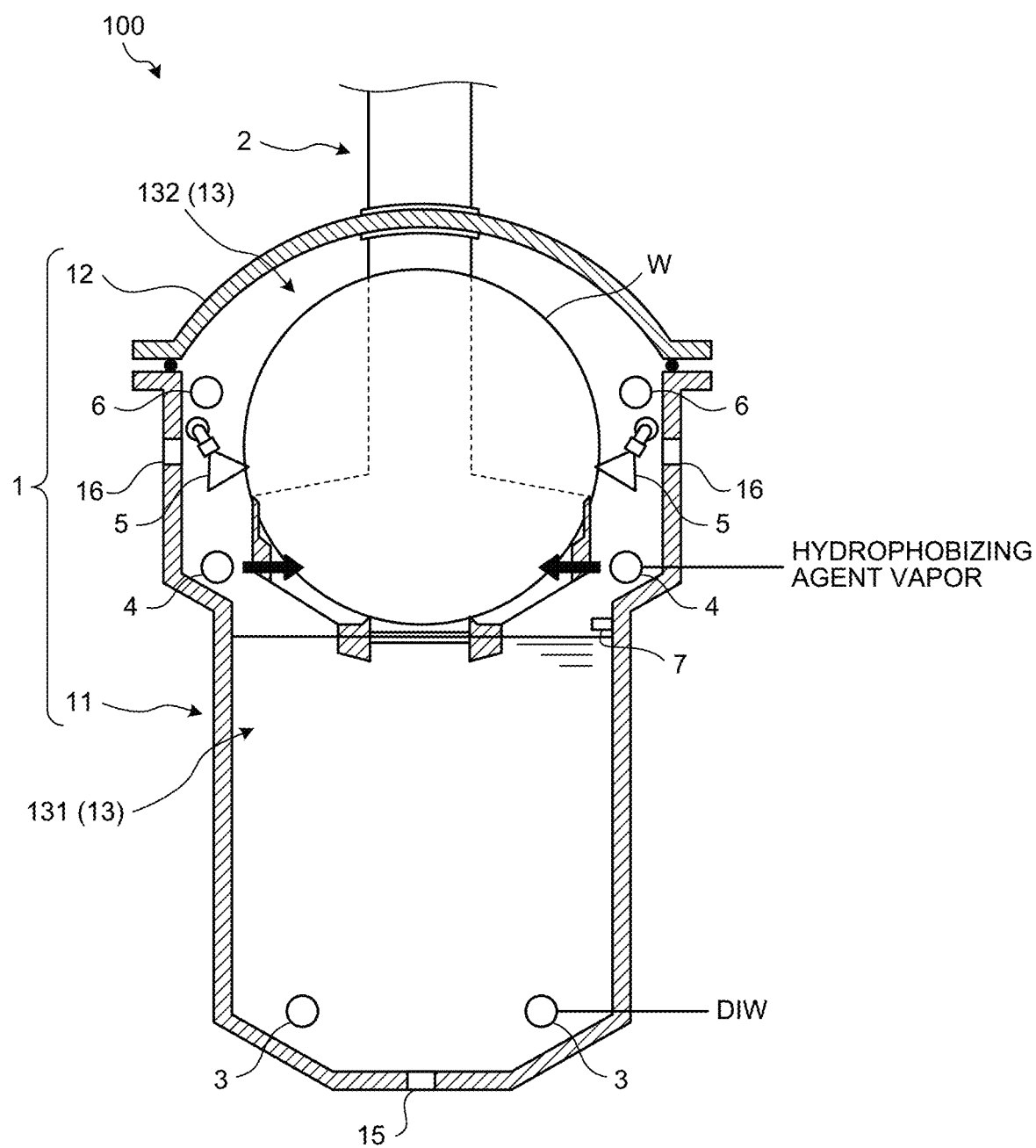
FIG. 9 is a diagram that illustrates an example of an operation of a substrate processing apparatus according to an embodiment.
Figure 10:
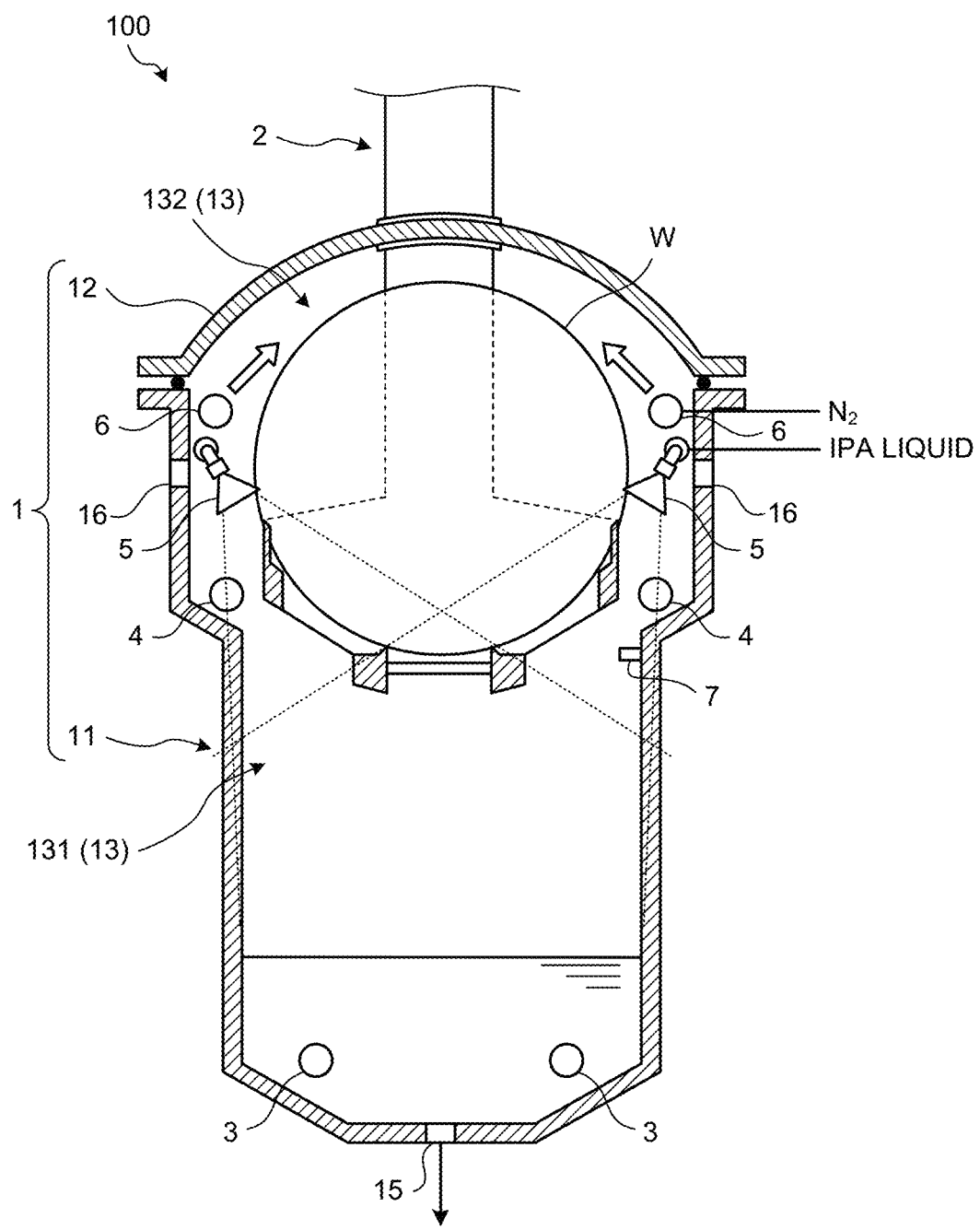
FIG. 10 is a diagram that illustrates an example of an operation of a substrate processing apparatus according to an embodiment.
Figure 11:
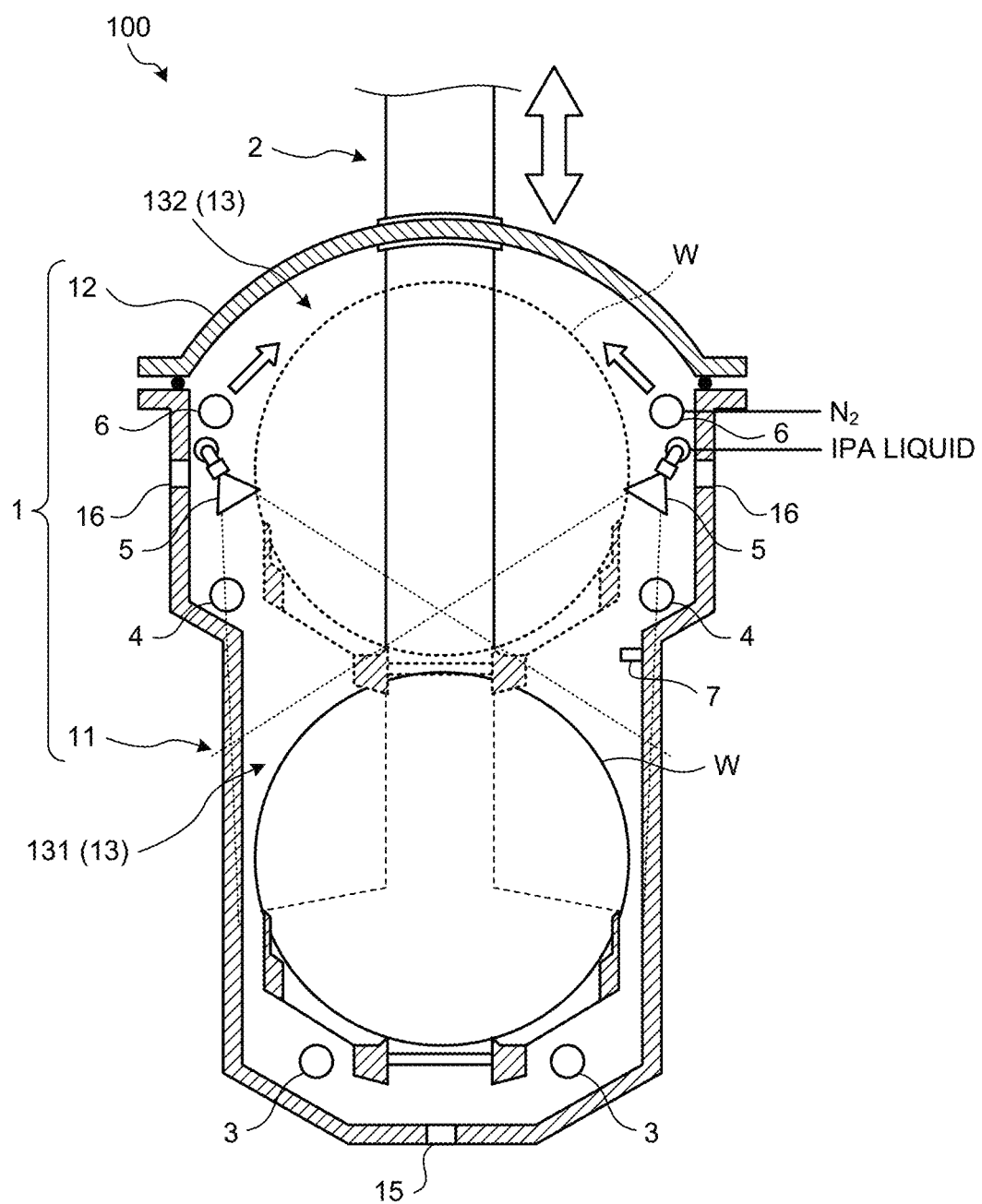
FIG. 11 is a diagram that illustrates an example of an operation of a substrate processing apparatus according to an embodiment.
Figure 12:
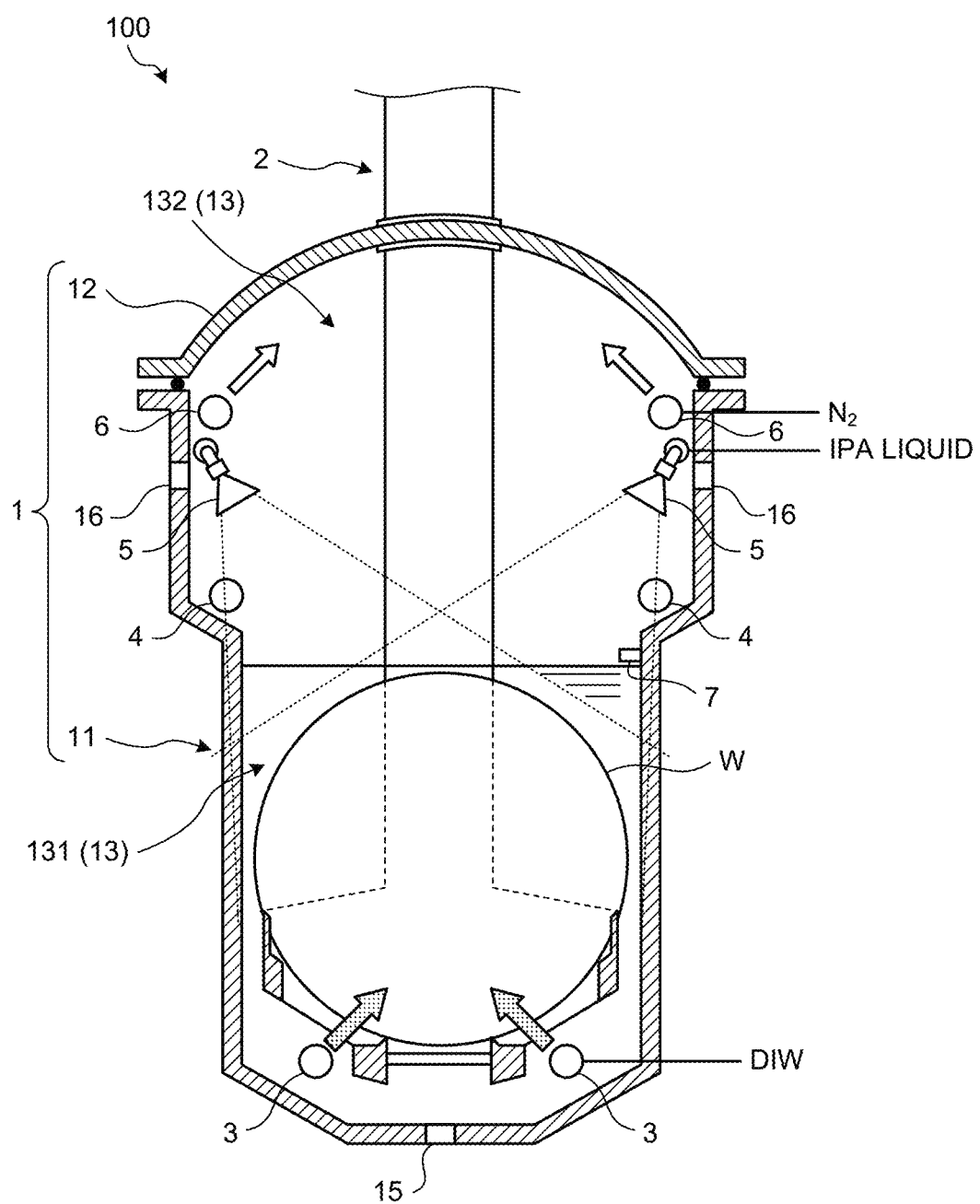
FIG. 12 is a diagram that illustrates an example of an operation of a substrate processing apparatus according to an embodiment.

Specifically, the controller 81 opens the valve 34 so as to store a DIW in the processing tank 11 and controls the vapor supply system 45 so as to supply a vapor of a hydrophobizing agent from a hydrophobizing agent nozzle 4 to the drying area 132 (see FIG. 8). Supply of a vapor of a hydrophobizing agent thereto is also continued after storing of a DIW in the processing tank 11 is completed (see FIG. 9). A gas in the drying area 132 is discharged from an exhaust port 16 and a vapor of a hydrophobizing agent is supplied to the drying area 132, so that an atmosphere in the drying area 132 is replaced with such a vapor of a hydrophobizing agent. Thereby, IPA on a plurality of substrates W is replaced with a hydrophobizing agent, so that a plurality of substrates W are hydrophobized.

In the substrate processing apparatus 100 according to an embodiment, a vapor of a hydrophobizing agent is supplied to the drying area 132 in a state where a DIW is stored in the processing tank 11, in a hydrophobizing process, so that it is possible to prevent or reduce attaching of a residue of a hydrophobizing agent to an inner wall of the processing tank 11.

Subsequently, the controller 81 controls the vapor supply system 45 so as to stop supply of a hydrophobizing agent vapor from a hydrophobizing agent nozzle 4 to the drying area 132. Subsequently, the controller 81 opens the valve 152 so as to discharge a DIW from the processing tank 11 and opens the valve 54 so as to supply an IPA liquid from a second organic solvent nozzle 6 to the gastight space 13 (see FIG. 10). A second organic solvent nozzle 6 sprays an IPA liquid in a conical form or a fan-like form from the drying area 132 to the storage area 131. Thereby, it is possible to remove a hydrophobizing agent that is attached to an inner wall of the chamber 1, over a wide area.

Additionally, the controller 81 controls, after supply of a hydrophobizing agent vapor is stopped, a vapor supply system 65 so as to start supply of a hot $N_2$ gas from a second organic solvent nozzle 6 to the gastight space 13.

Subsequently, the controller 81 controls the movement mechanism 23 so as to move a plurality of substrates W from the drying area 132 to the storage area 131 (step S106). A process at step S106 corresponds to an example of a third arrangement step.

Subsequently, in the substrate processing apparatus 100, a second IPA replacement process where a hydrophobizing agent on a plurality of substrates W is replaced with IPA is executed (step S107). A second IPA replacement process corresponds to an example of a third replacement step.

Specifically, the controller 81 supplies an IPA liquid from a second organic solvent nozzle 6 to the storage area 131 at step S105. Furthermore, the controller 81 arranges a plurality of substrates W in the storage area 131 at step S106. As a result, in a second IPA replacement process, an IPA liquid is supplied to a plurality of substrates W, so that a hydrophobizing agent on such a plurality of substrates W is rinsed with IPA.

Furthermore, the controller 81 controls the movement mechanism 23 so as to cause a plurality of substrates W to reciprocate between the storage area 131 and the drying area 132 (see FIG. 11) in a state where an IPA liquid is discharged from the plurality of second organic solvent nozzles 6. Thus, a plurality of substrates W are moved, so that it is possible to supply IPA to such a plurality of substrates W evenly.

A number of reciprocation of a plurality of substrates W may be one or may be two or more. Furthermore, movement of a plurality of substrates W may be one-time movement from the storage area 131 to the drying area 132. Furthermore, the controller 81 does not have to move a plurality of substrates W.

A speed of movement in a case where a plurality of substrates W are moved may be, for example, a speed of 1 mm/sec or greater and 300 mm/sec or less. Thus, a plurality of substrates W are moved at a comparatively low speed, so that it is possible to supply an IPA liquid to such a plurality of substrates W more evenly.

The controller 81 stops movement of a plurality of substrates W that is executed by the movement mechanism 23, in a state where such a plurality of substrates W are located in the storage area 131. Furthermore, the controller 81 opens the valve 34 so as to store a DIW in the processing tank 11 while supply of an IPA liquid from a second organic solvent nozzle 6 to the gastight space 13 is continued. Thereby, a plurality of substrates W are dipped in a DIW, so that IPA that is attached to such a plurality of substrates W is rinsed with such a DIW (see FIG. 12).

Subsequently, in the substrate processing apparatus 100, a chamber cleaning process where a hydrophobizing agent that is attached to an inner wall of the chamber 1 is removed by IPA is executed (step S108).

Figure 13:
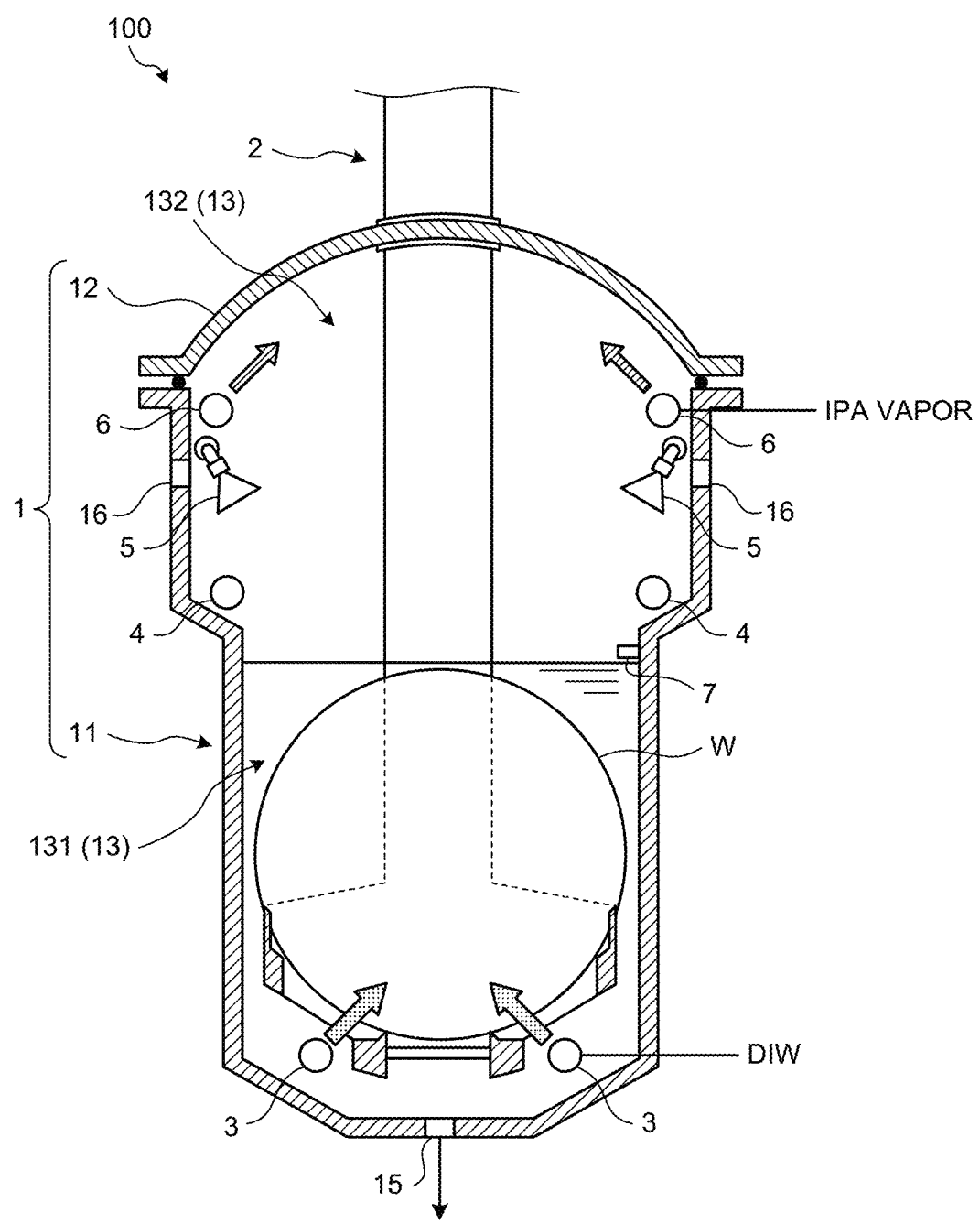
FIG. 13 is a diagram that illustrates an example of an operation of a substrate processing apparatus according to an embodiment.
Figure 14:
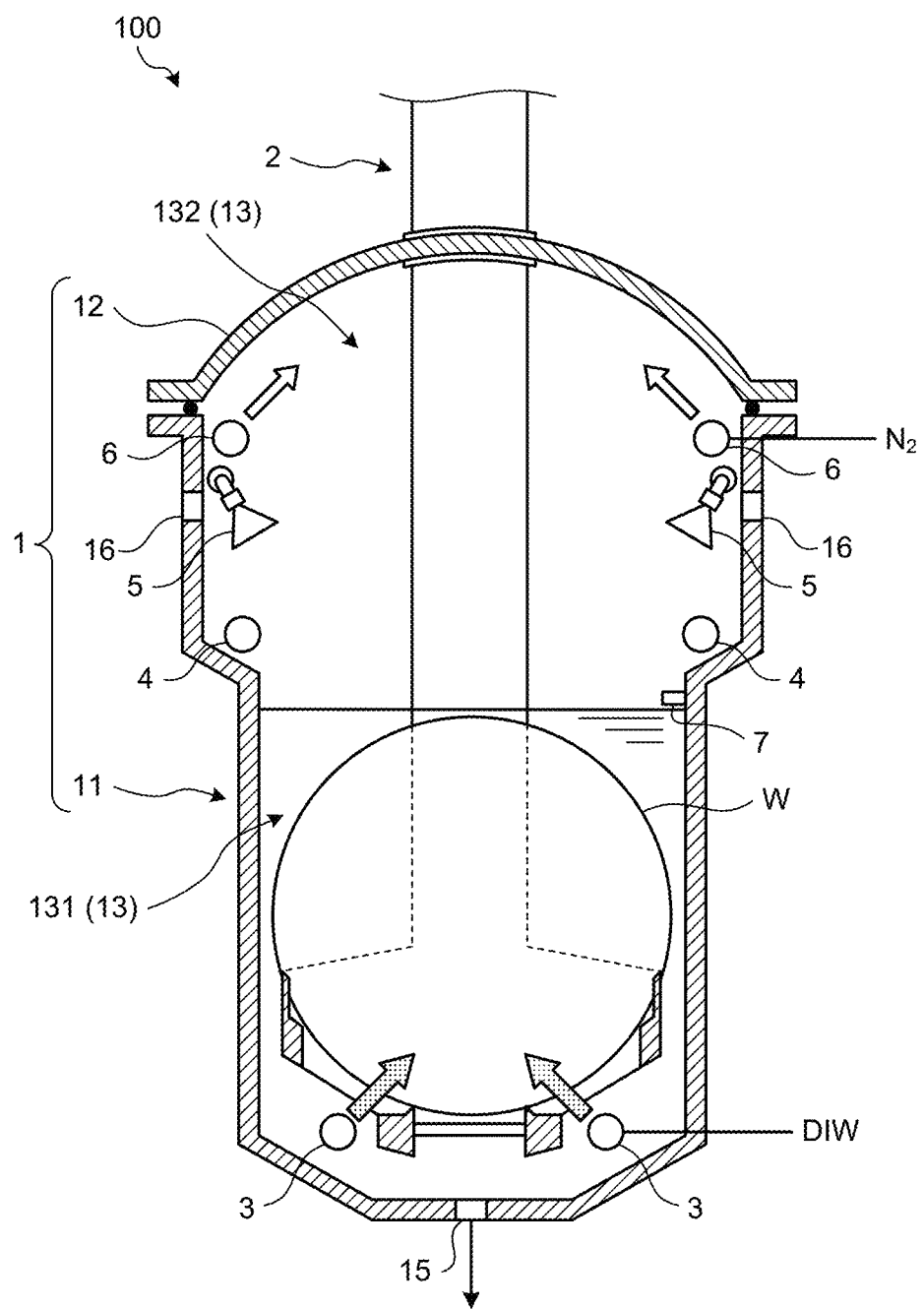
FIG. 14 is a diagram that illustrates an example of an operation of a substrate processing apparatus according to an embodiment.
Figure 15:
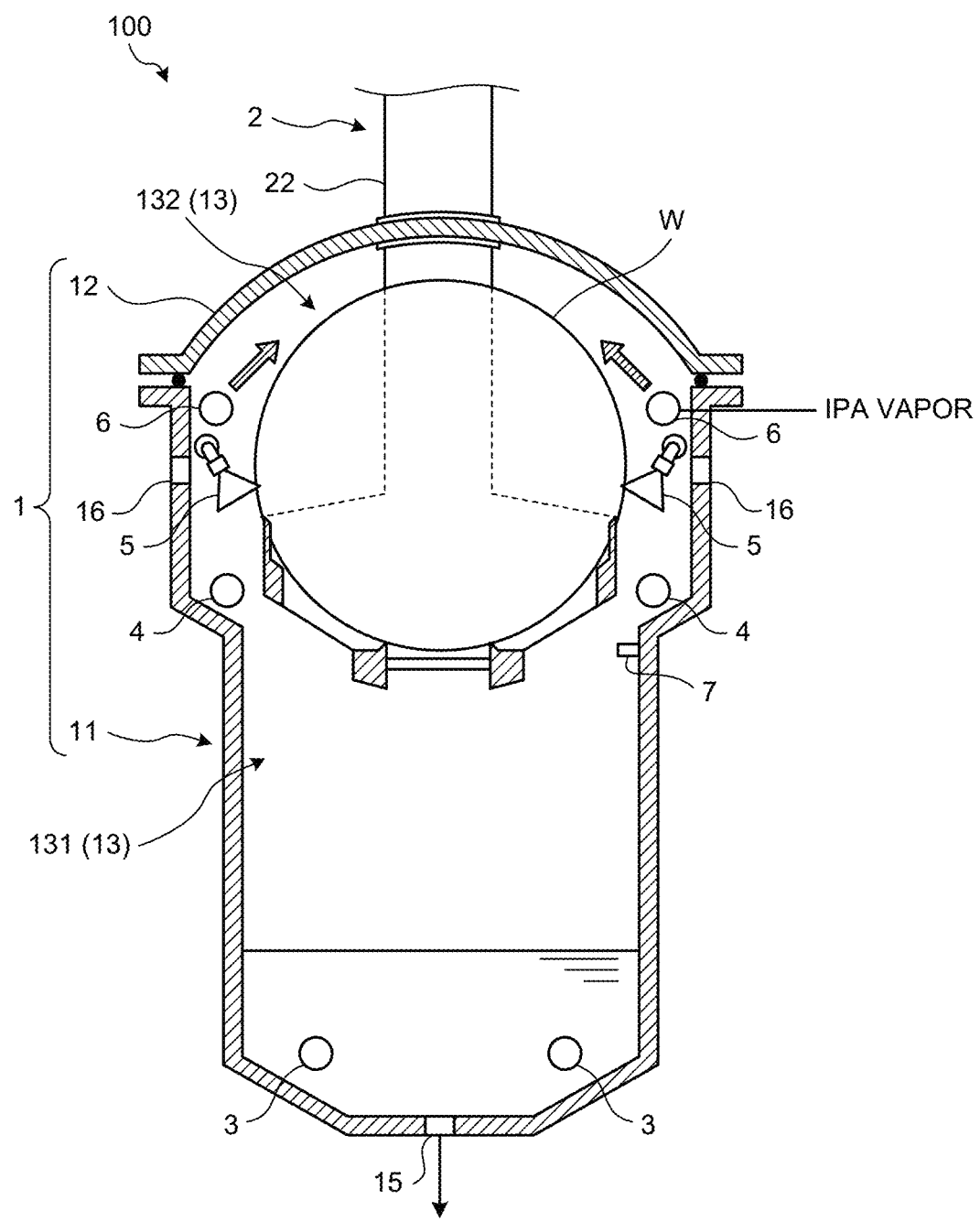
FIG. 15 is a diagram that illustrates an example of an operation of a substrate processing apparatus according to an embodiment.
Figure 16:
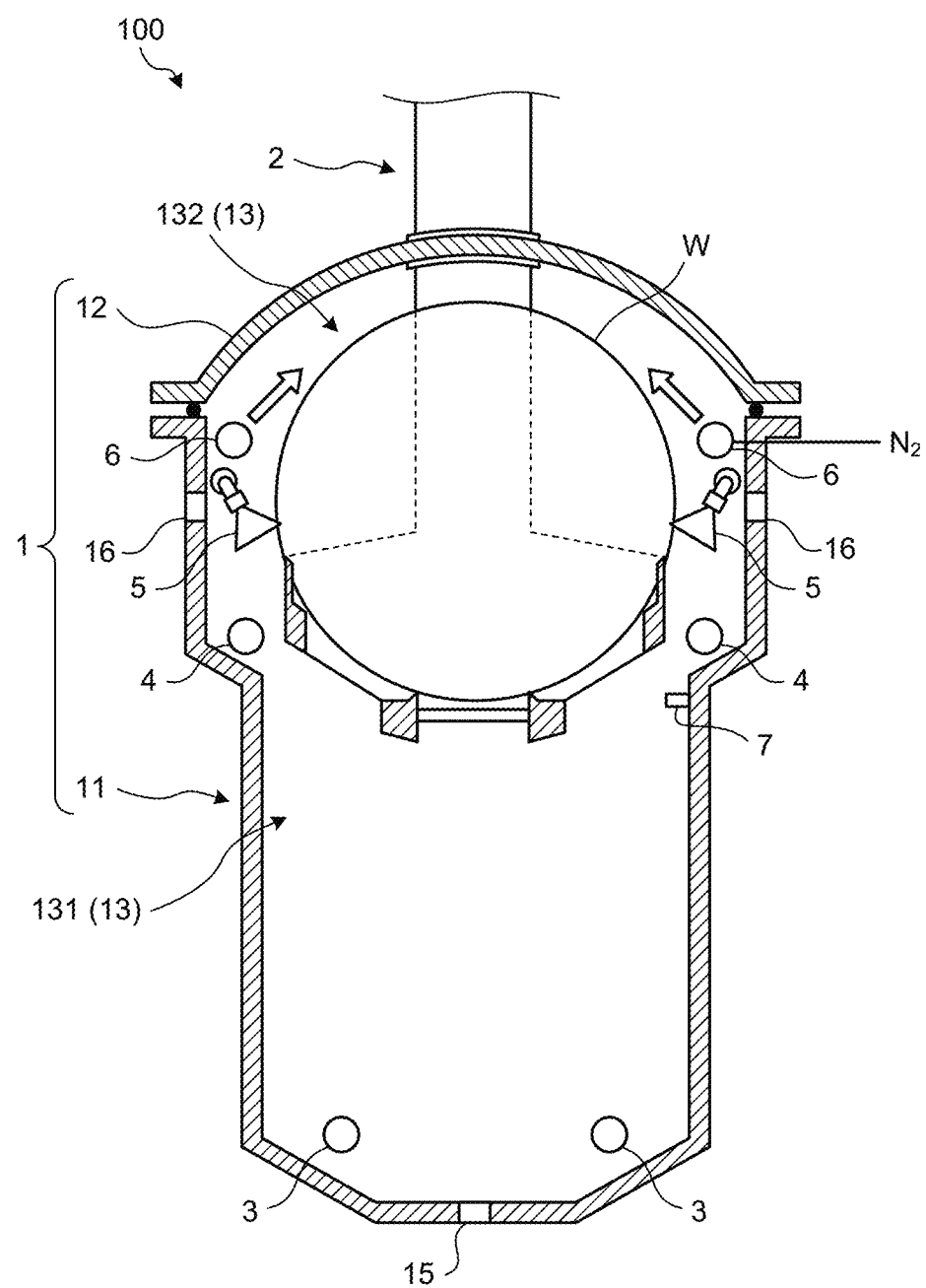
FIG. 16 is a diagram that illustrates an example of an operation of a substrate processing apparatus according to an embodiment.

Specifically, the controller 81 controls the vapor supply system 65 so as to supply an IPA vapor from a second organic solvent nozzle 6 to the gastight space 13 (the drying area 132) (see FIG. 13). A gas in the drying area 132 is discharged from the exhaust port 16 and an IPA vapor is supplied to the drying area 132, so that an atmosphere in the drying area 132 is replaced with such an IPA vapor. Thereby, a hydrophobizing agent that is attached to an inner wall of the chamber 1 is removed from such an inner wall of the chamber 1 by an IPA vapor. That is, an inner wall of the chamber 1 is cleaned.

Thus, in the substrate processing apparatus 100 according to an embodiment, a hydrophobizing agent that is attached to an inner wall of the chamber 1 is removed by an IPA vapor. Thereby, attaching of a residue of a hydrophobizing agent to an inner wall of the chamber 1 is prevented or reduced, and accordingly, transfer of a residue of a hydrophobizing agent from the chamber 1 to a plurality of substrates W is prevented or reduced. Therefore, it is possible for the substrate processing apparatus 100 according to an embodiment to prevent or reduce collapse of a pattern that is associated with attachment of a particle(s) to a plurality of substrates W.

Furthermore, in a chamber cleaning process, a plurality of substrates W are provided in a state where they are dipped in a DIW that is stored in the processing tank 11. Thus, while an IPA vapor is supplied thereto, a plurality of substrates W are dipped in water, so that it is possible to prevent or reduce attaching of a hydrophobizing agent that is removed from the chamber 1 to such a plurality of substrates W.

Herein, in a chamber cleaning process, a plurality of substrates W are dipped in a DIW so as to protect such a plurality of substrates W. This is not limiting, and a liquid where a plurality of substrates W are dipped, in a chamber cleaning process, may be a liquid other than a DIW. For example, in a chamber cleaning process, the substrate processing apparatus 100 may store IPA in the processing tank 11 and dip a plurality of substrates W in such IPA.

In a chamber cleaning process, the controller 81 discharges a DIW in the processing tank 11 from a drain port 15 and supplies a DIW from a rinse nozzle 3 to the processing tank 11. Thereby, it is possible for the substrate processing apparatus 100 to keep a DIW in the processing tank 11 in a clean state thereof during a chamber cleaning process.

Subsequently, the controller 81 controls the vapor supply system 65 so as to stop supply of an IPA vapor from a second organic solvent nozzle 6 to the gastight space 13 and end a chamber cleaning process.

Subsequently, in the substrate processing apparatus 100, a rinse process is executed (step S109). Specifically, the controller 81 continues a process that discharges a DIW in the processing tank 11 from the drain port 15 and supplies such a DIW from a rinse nozzle 3 to the processing tank 11, for a certain period of time (see FIG. 14). Thereby, it is possible to discharge, from the chamber 1, a hydrophobizing agent that is removed from an inner wall of the chamber 1 and/or IPA that is used for cleaning of the chamber 1, together with a DIW.

Furthermore, the controller 81 controls the vapor supply system 65 so as to supply a hot $N_2$ gas from a second organic solvent nozzle 6 to the gastight space 13. Thereby, an atmosphere in the gastight space 13 is replaced with an inert atmosphere.

Subsequently, in the substrate processing apparatus 100, a third IPA replacement process is executed (step S110). Specifically, the controller 81 controls the movement mechanism 23 so as to move a plurality of substrates W from the storage area 131 to the drying area 132 and controls the vapor supply system 65 so as to supply an IPA vapor from a second organic solvent nozzle 6 to the gastight space 13 (see FIG. 15). An IPA vapor contacts surfaces of a plurality of substrates W, so that a DIW that is attached to such surfaces of a plurality of substrates W is replaced with IPA.

The controller 81 discharges a DIW that is stored in processing tank 11 from the drain port 15, in parallel with supply of an IPA vapor to the gastight space 13 and lifting of a plurality of substrates W.

Subsequently, in the substrate processing apparatus 100, a drying gas supply process is executed (step S111). Specifically, the controller 81 controls the vapor supply system 65 so as to supply a hot $N_2$ gas from a second organic solvent nozzle 6 to the gastight space 13 (see FIG. 16). Thereby, volatilization of IPA that remains on surfaces of a plurality of substrates W is accelerated, so that such a plurality of substrates W are dried.

Subsequently, in the substrate processing apparatus 100, a carrying-out process is executed (step S112). Specifically, the controller 81 controls the movement mechanism 23 so as to lift the lid body 12 and a holding unit 2. Subsequently, the controller 81 controls a non-illustrated substrate transfer device so as to deliver a plurality of substrates W from a holding body 21 to such a non-illustrated substrate transfer device.

First Variation

Figure 17:
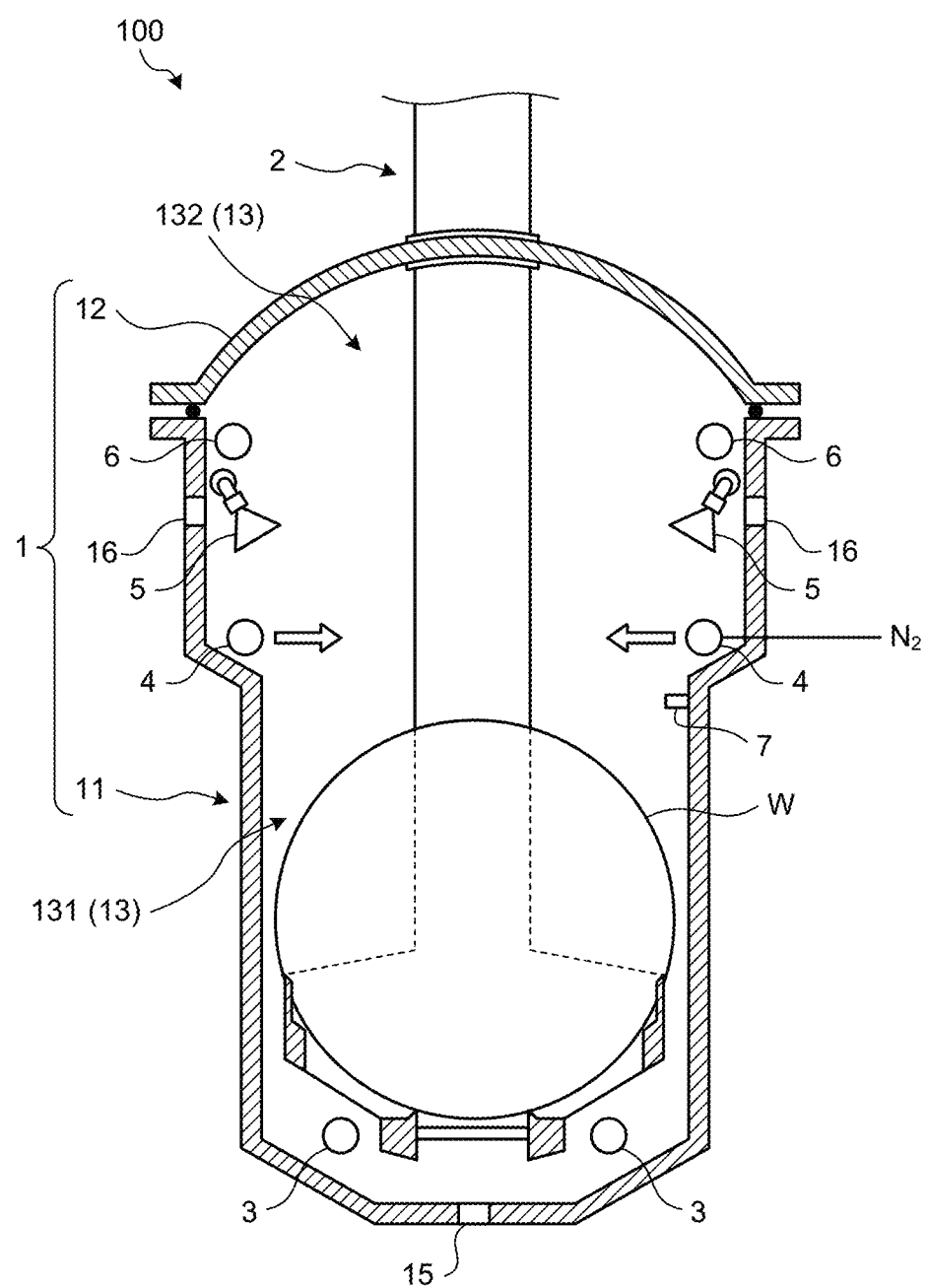
FIG. 17 is a diagram that illustrates an example of an operation of a substrate processing apparatus according to a first variation.
Figure 18:
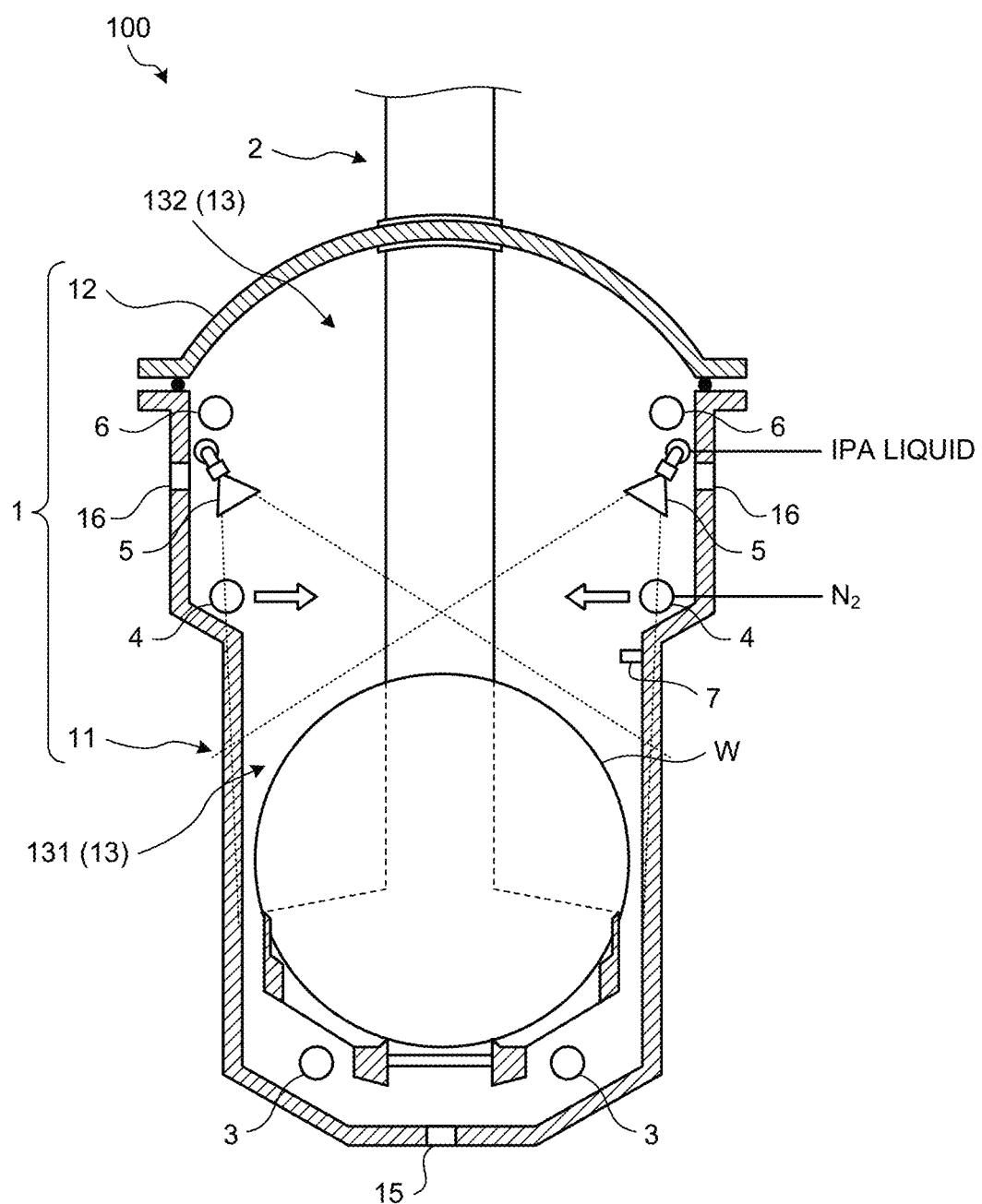
FIG. 18 is a diagram that illustrates an example of an operation of a substrate processing apparatus according to a first variation.
Figure 19:
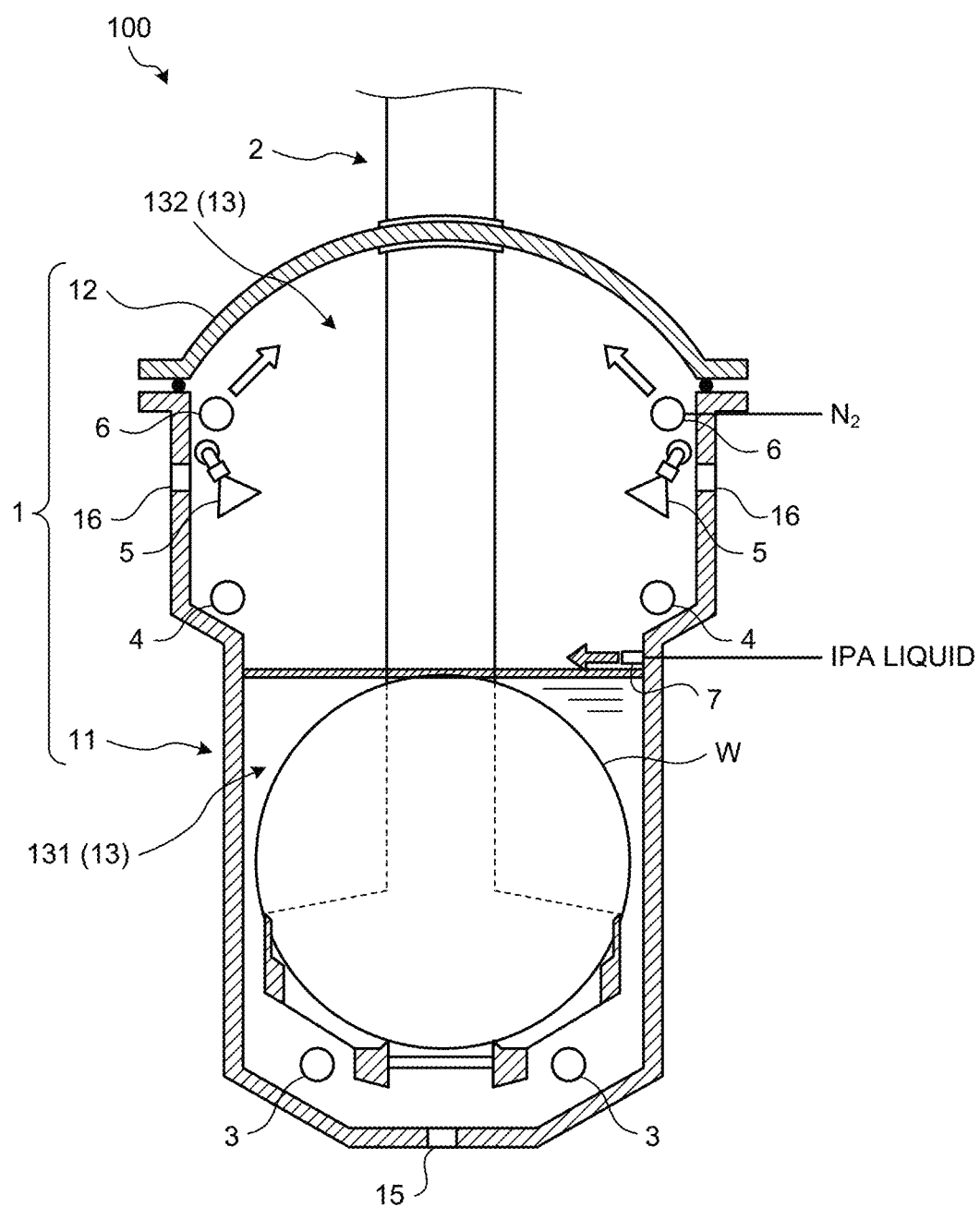
FIG. 19 is a diagram that illustrates an example of an operation of a substrate processing apparatus according to a second variation.

Next, a first variation of a substrate processing apparatus 100 according to an embodiment will be explained. FIG. 17 and FIG. 18 are diagrams that illustrate an example of an operation of a substrate processing apparatus 100 according to a first variation.

Although an example of a case where a DIW is stored in a processing tank 11 and a plurality of substrates W that are carried in are dipped in such a DIW, as a pre-rinse process, has been explained in an embodiment as described above, the substrate processing apparatus 100 does not have to dip such a plurality of substrates W that are carried in in such a DIW.

For example, a controller 81 arranges a plurality of substrates W that are carried in a chamber 1, in a storage area 131 in an empty state thereof (that is, where a DIW is not stored therein) (see FIG. 17). Then, for example, the controller 81 may omit a humidity conditioning process (step S102) and control a vapor supply system 65 so as to supply an IPA liquid from a second organic solvent nozzle 6 to a gastight space 13, as a first IPA replacement process (step S103) (see FIG. 18).

Thus, the substrate processing apparatus 100 according to a first variation omits a pre-rinse process, so that it is possible to prevent or reduce raising of a humidity of the gastight space 13. Therefore, it is possible for the substrate processing apparatus 100 according to a first variation to omit a humidity conditioning process (step S102) (or to attain reduction in time).

Second Variation

Next, a second variation of a substrate processing apparatus 100 according to an embodiment will be explained. FIG. 19 to FIG. 22 are diagrams that illustrate an example of an operation of a substrate processing apparatus 100 according to a second variation.

For example, the substrate processing apparatus 100 may execute an IPA liquid film cleaning process after a rinse process at step S109 and before a third IPA replacement process at step S110.

Specifically, a controller 81 opens a valve 74 so as to supply an IPA liquid from a third organic solvent nozzle 7 to a liquid level of a DIW that is stored in a processing tank 11, after a rinse process at step S109. Thereby, a liquid film of IPA is formed on a liquid level of a DIW (see FIG. 19).

Figure 20:
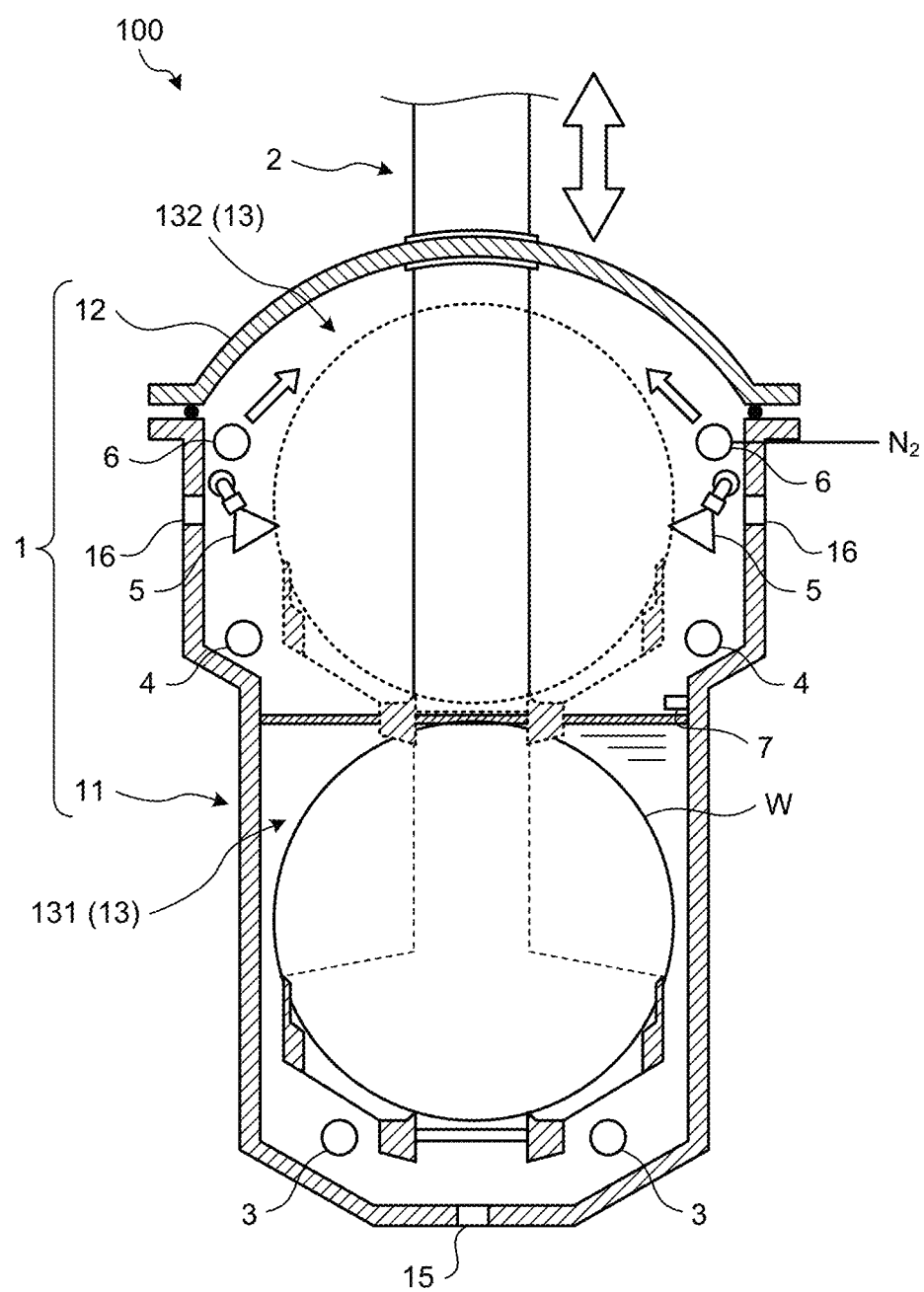
FIG. 20 is a diagram that illustrates an example of an operation of a substrate processing apparatus according to a second variation.
Figure 21:
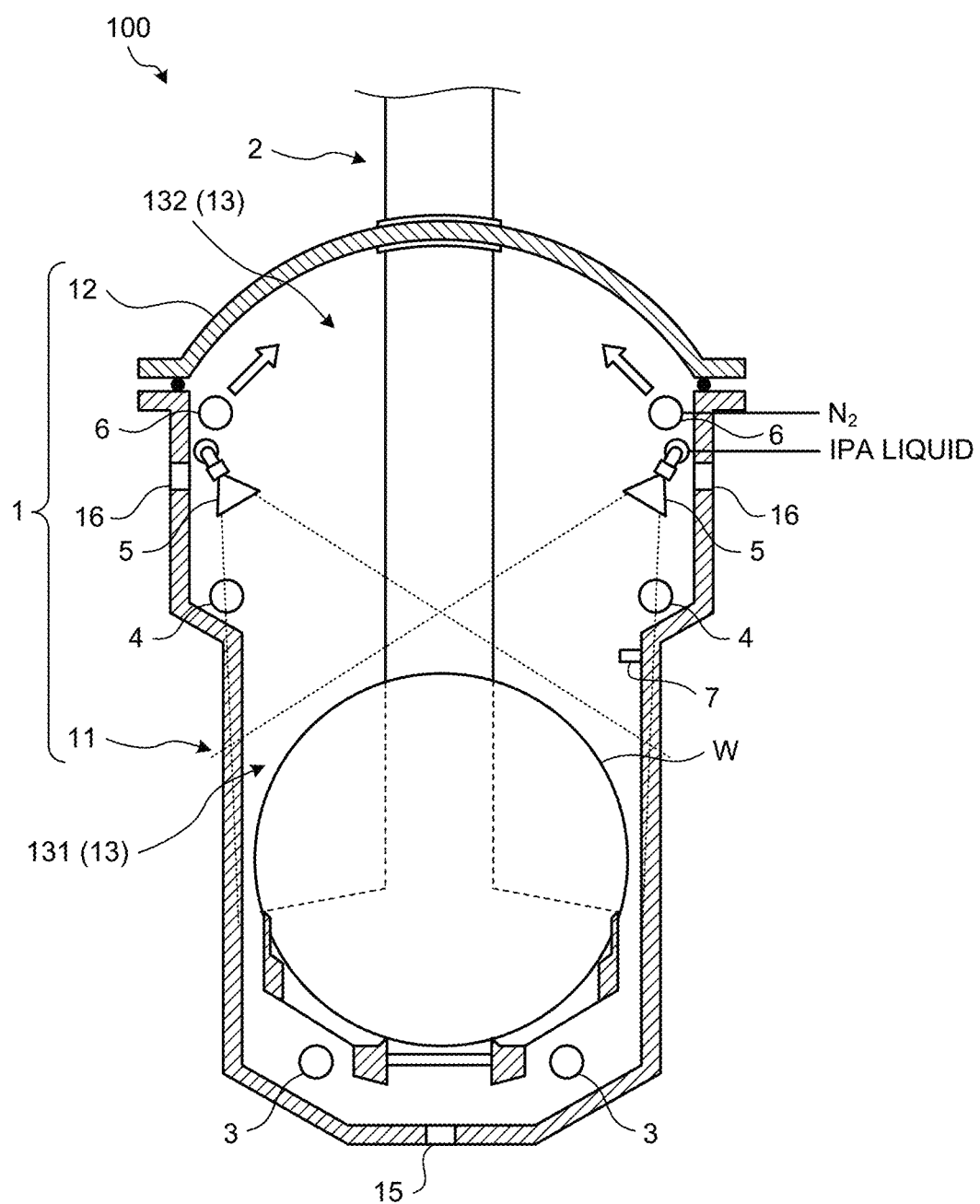
FIG. 21 is a diagram that illustrates an example of an operation of a substrate processing apparatus according to a second variation.

Subsequently, the controller 81 controls a movement mechanism 23 so as to lift a plurality of substrates W and thereby pass a liquid film of IPA (see FIG. 20).

Thus, a liquid film of IPA is formed on a liquid level of a DIW, so that, subsequently, in a process that lifts a plurality of substrates W from such a DIW, it is possible to attach IPA that is present on such a liquid level of a DIW to surfaces of such a plurality of substrates W. Thereby, it is possible to reduce an amount of a DIW that remains on a surface of a substrate W, so that it is possible to improve efficiency of replacement of such a DIW with IPA.

Additionally, the controller 81 may cause a plurality of substrates W to reciprocate between a storage area 131 and a drying area 132 so as to pass a liquid film of IPA through such a plurality of substrates W multiple times.

Subsequently, the controller 81 opens a valve 152 so as to discharge a DIW from the processing tank 11. Furthermore, the controller 81 opens a valve 54 so as to supply an IPA liquid from a first organic solvent nozzle 5 to a gastight space 13 (see FIG. 21). Thereby, it is possible to rinse a residue of IPA that is attached to a plurality of substrates W.

Figure 22:
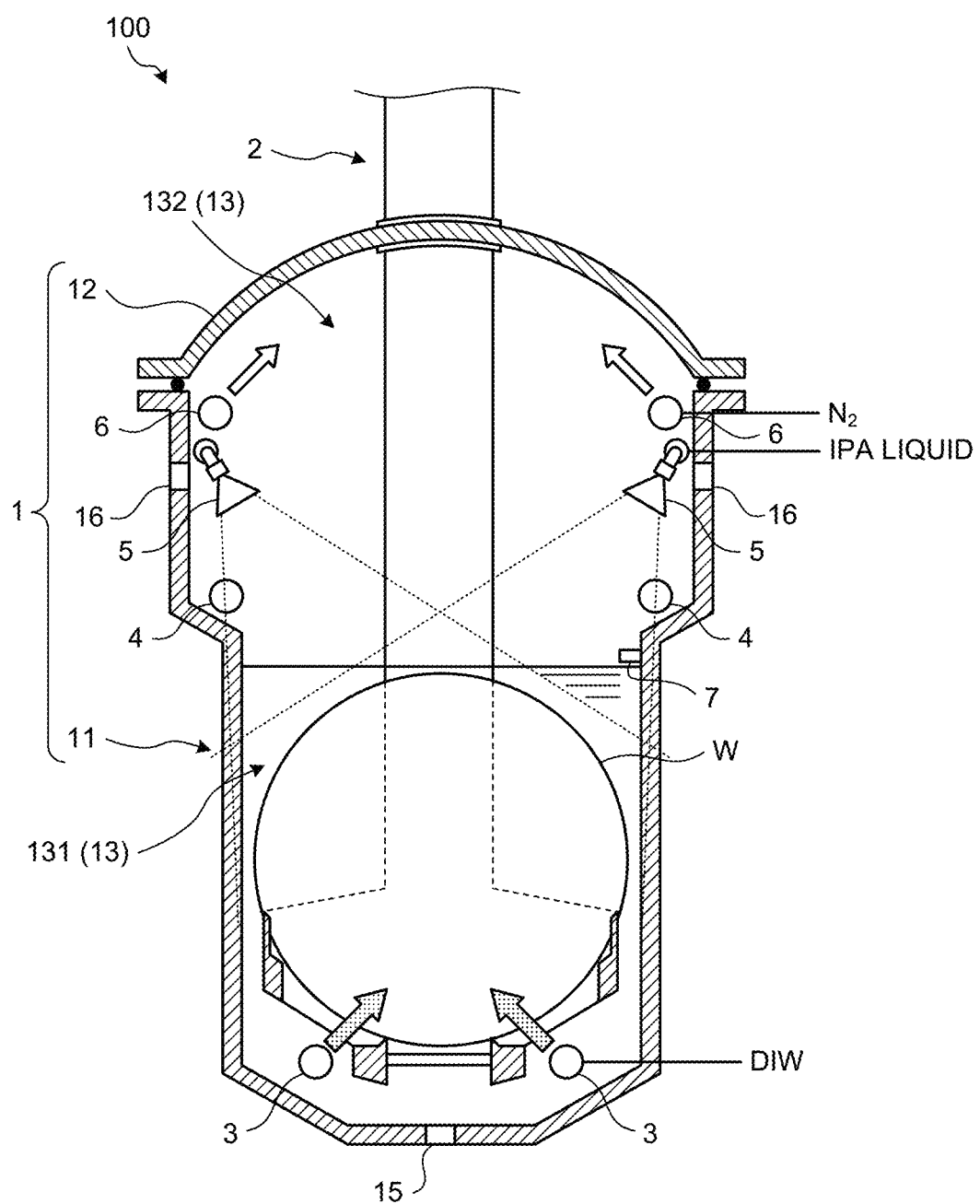
FIG. 22 is a diagram that illustrates an example of an operation of a substrate processing apparatus according to a second variation.

Subsequently, the controller 81 supplies an IPA liquid from a first organic solvent nozzle 5 to the gastight space 13, and opens a valve 34 so as to store a DIW in the processing tank 11 (see FIG. 22). Thereby, a plurality of substrates W are dipped in a DIW, so that IPA that is attached to such a plurality of substrates W is rinsed with such a DIW.

Third Variation

Figure 23:
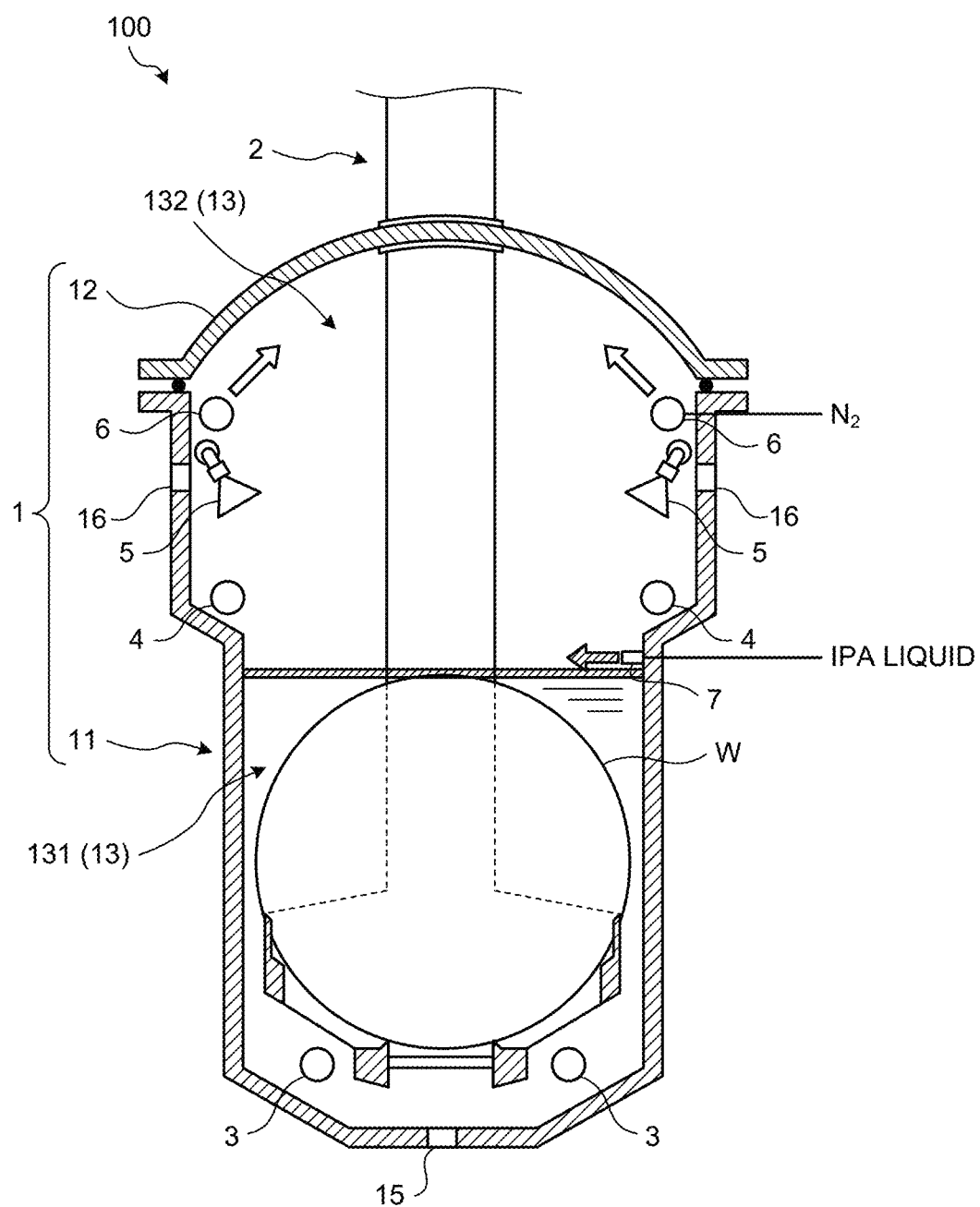
FIG. 23 is a diagram that illustrates an example of an operation of a substrate processing apparatus according to a third variation.
Figure 24:
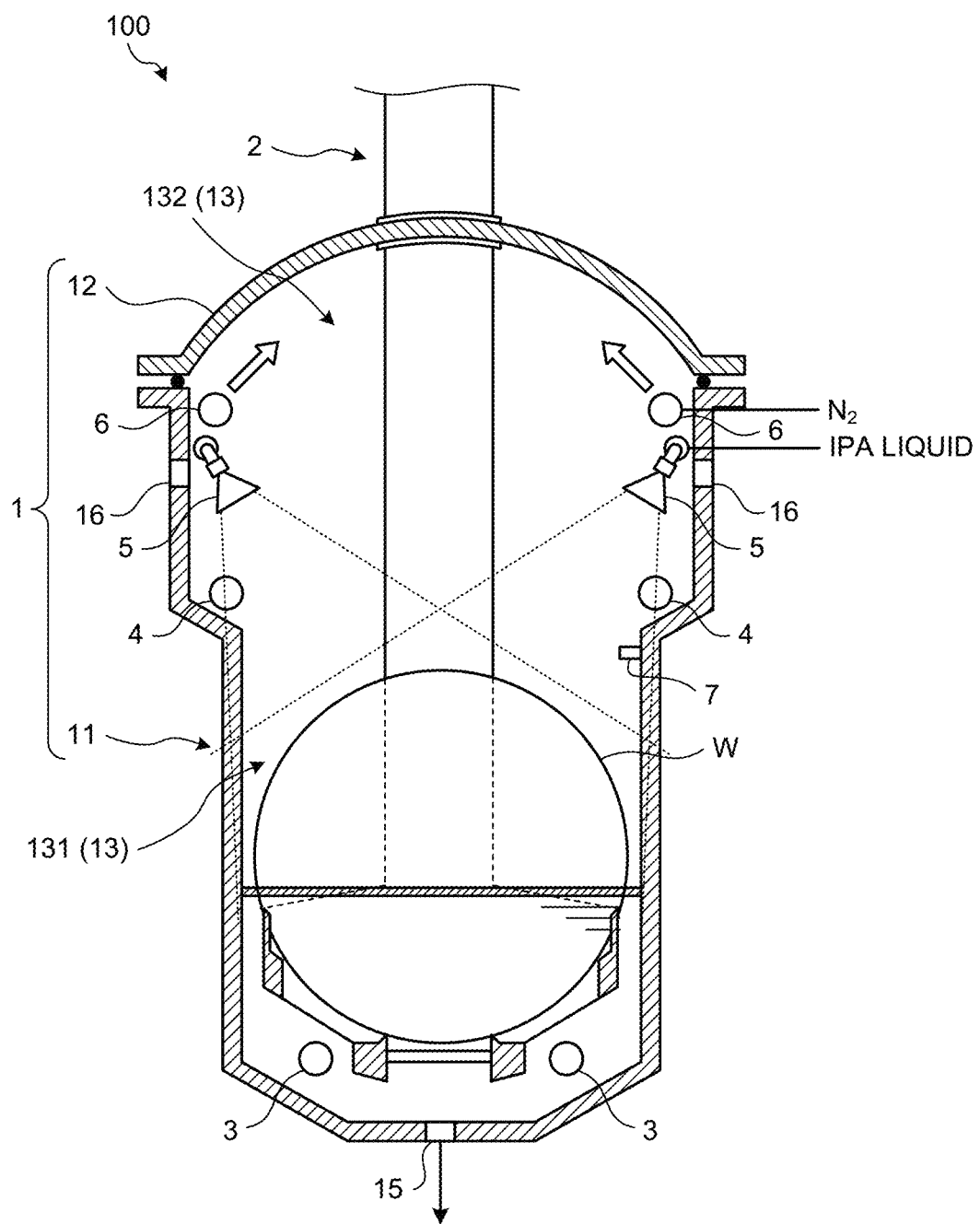
FIG. 24 is a diagram that illustrates an example of an operation of a substrate processing apparatus according to a third variation.

Next, a third variation of a substrate processing apparatus 100 according to an embodiment will be explained. FIG. 23 and FIG. 24 are diagrams that illustrate an example of an operation of a substrate processing apparatus 100 according to a third variation.

For example, the substrate processing apparatus 100 may execute an IPA liquid film cleaning process after a rinse process at step S109 and before a third IPA replacement process at step S110.

Specifically, a controller 81 opens a valve 74 so as to supply an IPA liquid from a third organic solvent nozzle 7 to a liquid level of a DIW that is stored in a processing tank 11, after a rinse process at step S109. Thereby, a liquid film of IPA is formed on a liquid level of a DIW (see FIG. 23).

Subsequently, the controller 81 opens a valve 152 so as to discharge a DIW from the processing tank 11 (see FIG. 24). Thereby, a position of a liquid film of IPA is also lowered as a liquid level of a DIW is lowered. Herein, a liquid film of IPA passes through a plurality of substrates W, so that IPA attaches to surfaces of such a plurality of substrates W.

Thus, a liquid film of IPA is formed on a liquid level of a DIW and subsequently such a liquid level of a DIW is lowered, so that it is possible to attach IPA that is present on such a liquid level of a DIW to surfaces of a plurality of substrates W. Thereby, it is possible to reduce an amount of a DIW that remains on a surface of a substrate W, so that it is possible to improve efficiency of replacement of such a DIW with IPA. Additionally, a subsequent process is similar to that of a third variation as described above so as to omit an explanation(s) thereof.

Fourth Variation

Figure 25:
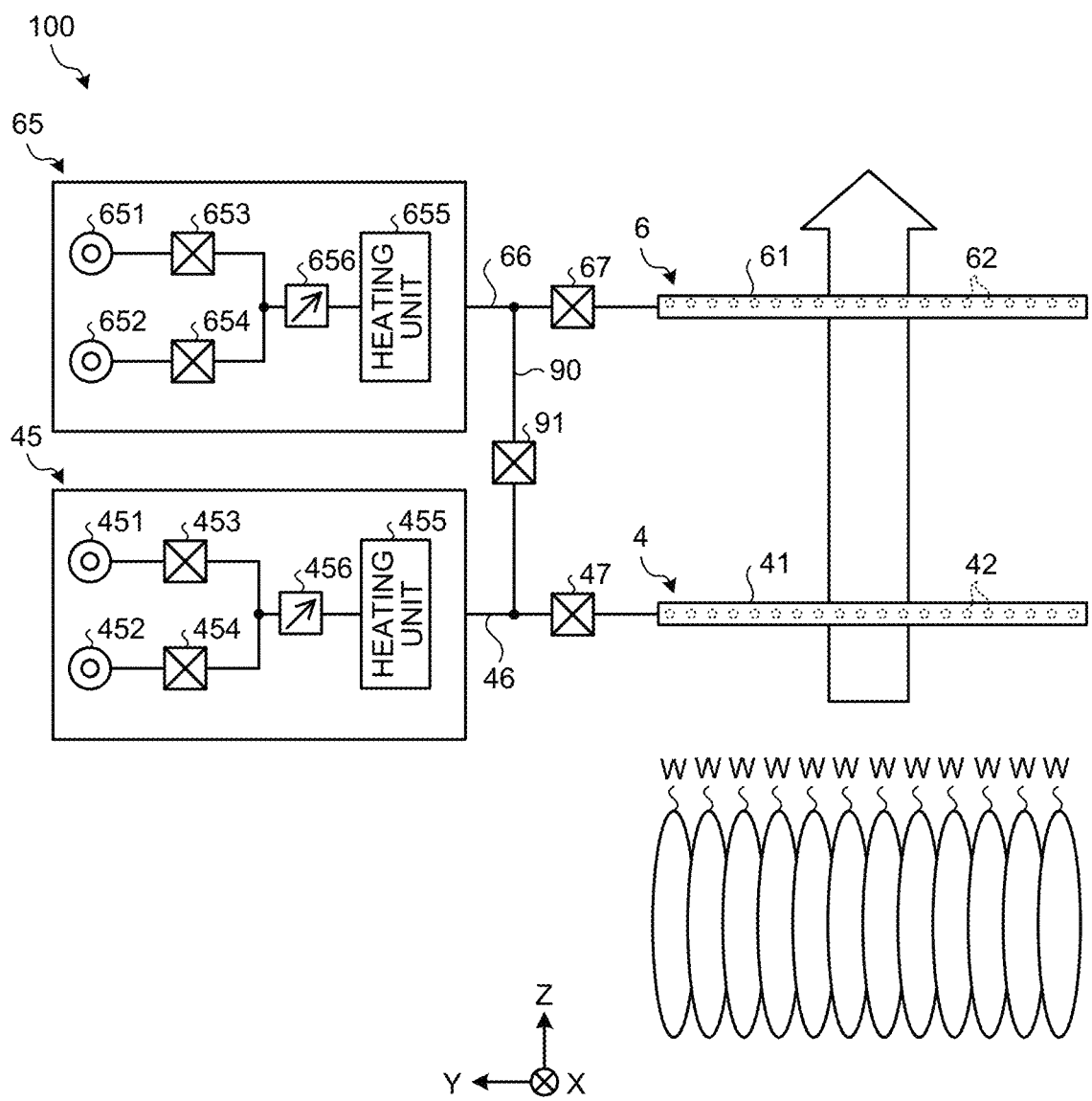
FIG. 25 is a schematic side view that illustrates a configuration of a hydrophobizing agent nozzle and a second organic solvent nozzle according to a fourth variation.

Next, a fourth variation of a substrate processing apparatus 100 according to an embodiment will be explained. FIG. 25 is a schematic side view that illustrates a configuration of a hydrophobizing agent nozzle 4 and a second organic solvent nozzle 6 according to a fourth variation.

As illustrated in FIG. 25, the substrate processing apparatus 100 may have a connection route 90 that connects a halfway part of a supply route 46 and a halfway part of a supply route 66. Furthermore, the substrate processing apparatus 100 may include a first valve 47, a second valve 67, and a third valve 91. The first valve 47 is provided on the supply route 46. For example, the first valve 47 is provided between a connection part of the supply route 46 and the connection route 90 and a hydrophobizing agent nozzle 4. The second valve 67 is provided on the supply route 66. For example, the second valve 67 is provided between a connection part of the supply route 66 and the connection route 90 and a second organic solvent nozzle 6. The third valve 91 is provided on the connection route 90. Such a first valve 47, second valve 67, and third valve 91 correspond to examples of a switching unit.

In the substrate processing apparatus 100 according to a fourth variation, a controller 81 controls the first valve 47, the second valve 67, and the third valve 91, so that it is possible to switch a destination of outflow of an IPA vapor between a second organic solvent nozzle 6 and a hydrophobizing agent nozzle 4. That is, the controller 81 closes the first valve 47 and the third valve 91 and opens the second valve 67, so that it is possible to discharge an IPA vapor from a second organic solvent nozzle 6. On the other hand, the controller 81 closes the second valve 67 and opens the first valve 47 and the third valve 91, so that it is possible to discharge an IPA vapor from a hydrophobizing agent nozzle 4.

Thereby, it is possible for the substrate processing apparatus 100 according to a fourth variation to remove a hydrophobizing agent that remains on a hydrophobizing agent nozzle 4 and/or the supply route 46 by an IPA vapor.

Furthermore, the controller 81 may alternately switch a destination of outflow of an IPA vapor between a second organic solvent nozzle 6 and a hydrophobizing agent nozzle 4, in a chamber cleaning process (step S108) and/or a third IPA replacement process (step S110). Thus, it is possible to deliver an IPA vapor to a drying area 132 evenly.

As has been described above, a substrate processing apparatus according to an embodiment (a substrate processing apparatus 100 as an example thereof) is a substrate processing apparatus that collectively executes a drying process for a plurality of substrates (substrates W as examples thereof) in a wet state thereof. The substrate processing apparatus according to an embodiment includes a chamber (a chamber 1 as an example thereof), a holding unit (a holding unit 2 as an example thereof), a hydrophobizing agent nozzle (a hydrophobizing agent nozzle 4 as an example thereof), a first organic solvent nozzle (a first organic solvent nozzle 5 as an example thereof), a second organic solvent nozzle (a second organic solvent nozzle 6 as an example thereof), and an exhaust port (an exhaust port 16 as an example thereof). The chamber has a gastight space (a gastight space 13 as an example thereof) that is capable of accommodating the plurality of substrates. The holding unit lifts or lowers the plurality of substrates between a storage area (a storage area 131 as an example thereof) where a liquid (a DIW as an example thereof) is stored in the gastight space and a drying area (a drying area 132 as an example thereof) that is located above the storage area in the gastight space. The hydrophobizing agent nozzle supplies a vapor of a hydrophobizing agent to the drying area. The first organic solvent nozzle supplies an organic solvent (an IPA liquid as an example thereof) from the drying area to the storage area. The second organic solvent nozzle supplies a vapor of an organic solvent (an IPA vapor as an example thereof) to the drying area. The exhaust port discharges a gas in the gastight space.

It is possible for a substrate processing apparatus according to an embodiment to remove a hydrophobizing agent that is attached to an inner wall of a chamber by using a vapor of an organic solvent that is supplied from a second organic solvent nozzle. Thereby, attaching of a residue of a hydrophobizing agent to an inner wall of a drying chamber is prevented or reduced, so that it is possible to prevent or reduce transfer of a residue of a hydrophobizing agent from a chamber to a substrate. Therefore, it is possible for a substrate processing apparatus according to an embodiment to prevent or reduce collapse of a pattern that is associated with attachment of a particle(s) to a substrate.

The first organic solvent nozzle and the second organic solvent nozzle may be arranged above the hydrophobizing agent nozzle.

A second organic solvent nozzle is arranged above a hydrophobizing agent nozzle, so that it is possible to clean an inner wall of a chamber that is located at a comparatively upper side thereof efficiently by using a vapor of an organic solvent. Furthermore, a first organic solvent nozzle is arranged above a hydrophobizing agent nozzle, so that it is possible to clean an inner wall of a chamber that is located at a comparatively lower side thereof efficiently.

The second organic solvent nozzle may supply a vapor of an organic solvent upward or obliquely upward. As such a configuration is provided, it is possible to clean an inner wall of a chamber that is located at a comparatively upper side thereof efficiently.

The substrate processing apparatus according to an embodiment includes a connection route (a connection route 90 as an example thereof), and a switching unit (a first valve 47, a second valve 67, and a third valve 91 as examples thereof). The connection route connects a halfway part of a second organic solvent supply route (a supply route 66 as an example thereof) that supplies a vapor of an organic solvent to the second organic solvent nozzle and a halfway part of a hydrophobizing agent supply route (a supply route 46 as an example thereof) that supplies a hydrophobizing agent to the hydrophobizing agent nozzle. The switching unit switches a destination of outflow of a vapor of an organic solvent between the second organic solvent nozzle and the hydrophobizing agent nozzle.

As such a configuration is provided, it is possible to clean an inner wall of a chamber more evenly. Furthermore, it is possible to remove a hydrophobizing agent that remains in an inside of a hydrophobizing agent supply route by a vapor of an organic solvent. Hence, it is possible to prevent or reduce attaching of a reside of a hydrophobizing agent to an inside of a hydrophobizing agent supply route and transfer of a reside of a hydrophobizing agent that is attached to such an inside of a hydrophobizing agent supply route to a substrate. Therefore, it is possible for a substrate processing apparatus according to an embodiment to further prevent or reduce collapse of a pattern that is associated with attachment of a particle(s) to a substrate.

The substrate processing apparatus according to an embodiment may include a first vaporizer (a vapor supply system 65 as an example thereof) that vaporizes a hydrophobizing agent, and a second vaporizer (a vapor supply system 45 as an example thereof) that vaporizes an organic solvent.

As such a configuration is provided, it is possible to vaporize a hydrophobizing agent and an organic solvent on respective suitable conditions (temperatures, etc.) thereof.

The first organic solvent nozzle may spray an organic solvent in a conical form or a fan-like form.

As such a configuration is provided, it is possible to supply an organic solvent to a plurality of substrates efficiently and it is also possible to supply such an organic solvent to an inner wall of a chamber efficiently.

The hydrophobizing agent nozzle and the second organic solvent nozzle includes a body unit (body units 41, 61 as examples thereof), and a plurality of discharge holes (discharge ports 42, 62 as examples thereof). The body unit is a member with a cylindrical shape that extends along an arrangement direction of the plurality of substrates. The plurality of discharge holes are formed on the body unit at an interval(s) along an arrangement direction of the plurality of substrates.

As such a configuration is provided, it is possible to supply a vapor of a hydrophobizing agent and a vapor of an organic solvent to an inside of a chamber by a comparatively simple configuration.

The exhaust port may be arranged above the hydrophobizing agent nozzle. As such a configuration is provided, it is possible to discharge a vapor that fills a drying area efficiently.

Furthermore, a substrate processing method according to an embodiment is a substrate processing method that collectively executes a drying process for a plurality of substrates in a wet state thereof. The substrate processing method according to an embodiment includes a first arrangement step (step S101 as an example thereof), a first replacement step (step S103 as an example thereof), a second arrangement step (step S104 as an example thereof), a second replacement step (step S105 as an example thereof), a third arrangement step (step S106 as an example thereof), a third replacement step (step S107 as an example thereof), and a chamber cleaning step (step S108 as an example thereof). The first arrangement step arranges the plurality of substrates in a storage area of a chamber that is capable of accommodating the plurality of substrates where the chamber has a gastight space that includes the storage area where a liquid is stored and a drying area that is located above the storage area. The first replacement step supplies an organic solvent from a first organic solvent nozzle to the plurality of substrates so as to replace a liquid that is attached to the plurality of substrates with an organic solvent, after the first arrangement step. The second arrangement step arranges the plurality of substrates in the drying area, after the first replacement step. The second replacement step supplies a vapor of a hydrophobizing agent from a hydrophobizing agent nozzle to the plurality of substrates so as to replace an organic solvent that is attached to the plurality of substrates with a hydrophobizing agent, after the second arrangement step. The third arrangement step arranges the plurality of substrates in the storage area, after the second replacement step. The third replacement step supplies an organic solvent from the first organic solvent nozzle to the plurality of substrates so as to replace a hydrophobizing agent that is attached to the plurality of substrates with an organic solvent, after the third arrangement step. The chamber cleaning step supplies a vapor of an organic solvent from a second organic solvent nozzle to the drying area in a state where a liquid (a DIW as an example thereof) is stored in the storage area and the plurality of substrates are dipped in a liquid, so as to clean the chamber, after the third replacement step.

Therefore, it is possible for a substrate processing method according to an embodiment to prevent or reduce collapse of a pattern that is associated with attachment of a particle(s) to a substrate.

The first arrangement step may arrange the plurality of substrates in the storage area where a liquid is stored, so as to dip the plurality of substrates in a liquid. Furthermore, the substrate processing method according to an embodiment may further include a humidity conditioning step (step S102 as an example thereof) that supplies a drying gas (a hot $N_2$ gas as an example thereof) to the drying area for at least a period of time after the first arrangement step and before the second replacement step.

As such a configuration is provided, it is possible to prevent or reduce deactivation of a hydrophobizing agent.

The first replacement step may supply an organic solvent from the first organic solvent nozzle to the plurality of substrates while the plurality of substrates are moved from the storage area to the drying area.

As such a configuration is provided, it is possible to supply an organic solvent to a plurality of substrates evenly.

The first replacement step may supply an organic solvent from the first organic solvent nozzle to the plurality of substrates while the plurality of substrates are caused to reciprocate between the storage area and the drying area at least one time.

As such a configuration is provided, it is possible to supply an organic solvent to a plurality of substrates more evenly.

The first replacement step may move the plurality of substrates at a speed of 1 mm/sec or greater and 300 mm/sec or less.

A plurality of substrates are moved at a comparatively low speed, so that it is possible to supply an organic solvent to a plurality of substrates more evenly.

The third replacement step may supply an organic solvent from the first organic solvent nozzle to the plurality of substrates while the plurality of substrates are moved from the storage area to the drying area.

As such a configuration is provided, it is possible to supply an organic solvent to a plurality of substrates evenly.

The third replacement step may supply an organic solvent from the first organic solvent nozzle to the plurality of substrates while the plurality of substrates are caused to reciprocate between the storage area and the drying area at least one time.

As such a configuration is provided, it is possible to supply an organic solvent to a plurality of substrates more evenly.

The third replacement step may move the plurality of substrates at a speed of 1 mm/sec or greater and 300 mm/sec or less.

A plurality of substrates are moved at a comparatively low speed, so that it is possible to supply an organic solvent to such a plurality of substrates more evenly.

The first arrangement step may arrange the plurality of substrates in the storage area in an empty state thereof.

A humidity of a drying area is not readily increased as compared with a case where a plurality of substrates are dipped in a liquid that is stored in a storage area, so that it is possible to prevent or reduce deactivation of a hydrophobizing agent.

The substrate processing method according to an embodiment may include a dipping step, a liquid film formation step, and a passing step. The dipping step stores a liquid (a DIW as an example thereof) in the storage area so as to dip the plurality of substrates in a liquid, after the third replacement step and before the chamber cleaning step. The liquid film formation step forms a liquid film of an organic solvent on a surface of a liquid that is stored in the storage area, after the dipping step and before the chamber cleaning step. The passing step moves the plurality of substrates from the storage area to the drying area so as to pass the liquid film therethrough, after the liquid film formation step and before the chamber cleaning step.

Thereby, it is possible to supply an organic solvent to a plurality of substrates more evenly.

The passing step may cause the plurality of substrates to reciprocate between the storage area and the drying area at least one time.

It is possible to supply an organic solvent to a plurality of substrates more evenly.

The substrate processing method according to an embodiment may include a dipping step, a liquid film formation step, and a passing step. The dipping step stores a liquid (a DIW as an example thereof) in the storage area so as to dip the plurality of substrates in a liquid, after the third replacement step and before the chamber cleaning step. The liquid film formation step forms a liquid film of an organic solvent on a surface of a liquid that is stored in the storage area, after the dipping step and before the chamber cleaning step. The passing step discharges a liquid that is stored in the storage area from the storage area so as to lower a position of the liquid film and passes the plurality of substrates therethrough, after the liquid film formation step and before the chamber cleaning step.

It is possible to supply an organic solvent to a plurality of substrates more evenly.

According to the present disclosure, it is possible to prevent or reduce collapse of a pattern that is associated with attachment of a particle(s) to a substrate.

It should be considered that an embodiment(s) that is/are disclosed herein is/are not limitative but is/are illustrative in all respects. In fact, it is possible to implement an embodiment(s) as described above in a variety of forms. Furthermore, an embodiment(s) as described above may be omitted, substituted, or modified in various forms without departing from an appended claim(s) and an essence thereof.

What is claimed is:

1. A substrate processing method that collectively executes a drying process for a plurality of substrates in a wet state thereof, comprising:
   a first arrangement step that arranges the plurality of substrates in a storage area of a chamber that is capable of accommodating the plurality of substrates where the chamber has a gastight space that includes the storage area where a liquid is stored and a drying area that is located above the storage area;
   a first replacement step that supplies an organic solvent from a first organic solvent nozzle to the plurality of substrates to replace a liquid that is attached to the plurality of substrates with an organic solvent, after the first arrangement step;
   a second arrangement step that arranges the plurality of substrates in the drying area, after the first replacement step;
   a second replacement step that supplies a vapor of a hydrophobizing agent from a hydrophobizing agent nozzle to the plurality of substrates to replace an organic solvent that is attached to the plurality of substrates with a hydrophobizing agent, after the second arrangement step;
   a third arrangement step that arranges the plurality of substrates in the storage area, after the second replacement step;
   a third replacement step that supplies an organic solvent from the first organic solvent nozzle to the plurality of substrates to replace a hydrophobizing agent that is attached to the plurality of substrates with an organic solvent, after the third arrangement step; and
   a chamber cleaning step that supplies a vapor of an organic solvent from a second organic solvent nozzle to the drying area in a state where a liquid is stored in the storage area and the plurality of substrates are dipped in a liquid, to clean the chamber, after the third replacement step.

2. The substrate processing method according to claim 1, wherein the first arrangement step arranges the plurality of substrates in the storage area where a liquid is stored, to dip the plurality of substrates in a liquid, further comprising a humidity conditioning step that supplies a drying gas to the drying area for at least a period of time after the first arrangement step and before the second replacement step.

3. The substrate processing method according to claim 2, wherein the first replacement step supplies an organic solvent from the first organic solvent nozzle to the plurality of substrates while the plurality of substrates are moved from the storage area to the drying area.

4. The substrate processing method according to claim 3, wherein the first replacement step supplies an organic solvent from the first organic solvent nozzle to the plurality of substrates while the plurality of substrates are caused to reciprocate between the storage area and the drying area at least one time.

5. The substrate processing method according to claim 3, wherein the first replacement step moves the plurality of substrates at a speed of 1 mm/sec or greater and 300 mm/sec or less.

6. The substrate processing method according to claim 2, wherein the third replacement step supplies an organic solvent from the first organic solvent nozzle to the plurality of substrates while the plurality of substrates are moved from the storage area to the drying area.

7. The substrate processing method according to claim 1, wherein the first replacement step supplies an organic solvent from the first organic solvent nozzle to the plurality of substrates while the plurality of substrates are moved from the storage area to the drying area.

8. The substrate processing method according to claim 7, wherein the first replacement step supplies an organic solvent from the first organic solvent nozzle to the plurality of substrates while the plurality of substrates are caused to reciprocate between the storage area and the drying area at least one time.

9. The substrate processing method according to claim 7 wherein the first replacement step moves the plurality of substrates at a speed of 1 mm/sec or greater and 300 mm/sec or less.

10. The substrate processing method according to claim 1, wherein the third replacement step supplies an organic solvent from the first organic solvent nozzle to the plurality of substrates while the plurality of substrates are moved from the storage area to the drying area.

11. The substrate processing method according to claim 10, wherein the third replacement step supplies an organic solvent from the first organic solvent nozzle to the plurality of substrates while the plurality of substrates are caused to reciprocate between the storage area and the drying area at least one time.

12. The substrate processing method according to claim 10, wherein the third replacement step moves the plurality of substrates at a speed of 1 mm/sec or greater and 300 mm/sec or less.

13. The substrate processing method according to claim 1, wherein the first arrangement step arranges the plurality of substrates in the storage area in an empty state thereof.

14. The substrate processing method according to claim 1, further comprising:

a dipping step that stores a liquid in the storage area to dip the plurality of substrates in a liquid, after the third replacement step and before the chamber cleaning step;

a liquid film formation step that forms a liquid film of an organic solvent on a surface of a liquid that is stored in the storage area, after the dipping step and before the chamber cleaning step; and a passing step that moves the plurality of substrates from the storage area to the drying area to pass the liquid film therethrough, after the liquid film formation step and before the chamber cleaning step.

15. The substrate processing method according to claim 14, wherein the passing step causes the plurality of substrates to reciprocate between the storage area and the drying area at least one time.

16. The substrate processing method according to claim 1, further comprising:

a dipping step that stores a liquid in the storage area to dip the plurality of substrates in a liquid, after the third replacement step and before the chamber cleaning step;

a liquid film formation step that forms a liquid film of an organic solvent on a surface of a liquid that is stored in the storage area, after the dipping step and before the chamber cleaning step; and a passing step that discharges a liquid that is stored in the storage area from the storage area to lower a position of the liquid film and passes the plurality of substrates therethrough, after the liquid film formation step and before the chamber cleaning step.

\* \* \* \* \*